US012772781B2

(12) United States Patent
Vintila et al.

(10) Patent No.: US 12,772,781 B2
(45) Date of Patent: Oct. 20, 2026

(54) APPARATUSES FOR MEASURING GAP BETWEEN A SUBSTRATE SUPPORT PLANE AND GAS DISTRIBUTION DEVICE

(71) Applicant: Lam Research Corporation, Fremont, CA (US)

(72) Inventors: Adriana Vintila, Wilsonville, OR (US); Shriram Vasant Bapat, Beaverton, OR (US); Emily Ann Alden, Portland, OR (US); Damien Martin Slevin, Salem, OR (US)

(73) Assignee: Lam Research Corporation, Fremont, CA (US)

( * ) Notice: Subject to any disclaimer, the term of this patent is extended or adjusted under 35 U.S.C. 154(b) by 344 days.

(21) Appl. No.: 18/557,250

(22) PCT Filed: Apr. 21, 2022

(86) PCT No.: PCT/US2022/025811
§ 371 (c)(1),
(2) Date: Oct. 25, 2023

(87) PCT Pub. No.: WO2022/231948
PCT Pub. Date: Nov. 3, 2022

(65) Prior Publication Data

US 2024/0213060 A1 Jun. 27, 2024

Related U.S. Application Data

(60) Provisional application No. 63/201,364, filed on Apr. 26, 2021.

(51) Int. Cl.
*H10P 72/00* (2026.01)
*C23C 16/455* (2006.01)

(52) U.S. Cl.
CPC .... *H10P 72/0604* (2026.01); *C23C 16/45565* (2013.01); *C23C 16/45597* (2013.01); *H10P 72/0421* (2026.01)

(58) Field of Classification Search
None
See application file for complete search history.

(56) References Cited

U.S. PATENT DOCUMENTS

| | | | |
|---|---|---|---|
| 5,571,366 | A | 11/1996 | Ishii et al. |
| 5,717,187 | A | 2/1998 | Rogozinski et al. |

(Continued)

FOREIGN PATENT DOCUMENTS

| | | | |
|---|---|---|---|
| CN | 101719462 A | 6/2010 | |
| CN | 102169145 A | 8/2011 | |

(Continued)

OTHER PUBLICATIONS

Gontard. L.C, et al., "A simple algorithm for measuring particle size distributions on an uneven background from TEM images," Ultramicroscopy, 2011, vol. 111 pp. 101-106.

(Continued)

*Primary Examiner* — Anthony Ho
(74) *Attorney, Agent, or Firm* — Weaver Austin Villeneuve & Sampson LLP

(57) ABSTRACT

Some embodiments provide apparatuses capable of enabling the measurement of various characteristics of a showerhead-substrate gap in a processing chamber, including at high temperatures and at low-light conditions, using an imaging system external to the processing chamber.

20 Claims, 13 Drawing Sheets

(56) References Cited

U.S. PATENT DOCUMENTS

| | | | |
|---|---|---|---|
| 6,077,386 | A | 6/2000 | Smith, Jr. et al. |
| 6,090,302 | A | 7/2000 | Smith, Jr. et al. |
| 6,123,983 | A | 9/2000 | Smith, Jr. et al. |
| 6,132,577 | A | 10/2000 | Smith, Jr. et al. |
| 6,134,005 | A | 10/2000 | Smith, Jr. et al. |
| 6,157,447 | A | 12/2000 | Smith, Jr. et al. |
| 6,165,312 | A | 12/2000 | Smith, Jr. et al. |
| 6,169,933 | B1 | 1/2001 | Smith, Jr. et al. |
| 6,192,826 | B1 | 2/2001 | Smith, Jr. et al. |
| 6,221,679 | B1 | 4/2001 | Smith, Jr. et al. |
| 6,223,755 | B1 | 5/2001 | Smith, Jr. et al. |
| 6,246,473 | B1 | 6/2001 | Smith, Jr. et al. |
| 6,254,717 | B1 | 7/2001 | Smith, Jr. et al. |
| 6,261,470 | B1 | 7/2001 | Smith, Jr. et al. |
| 6,269,278 | B1 | 7/2001 | Smith, Jr. et al. |
| 6,275,740 | B1 | 8/2001 | Smith, Jr. et al. |
| 6,381,022 | B1 | 4/2002 | Zavracky |
| 6,383,402 | B1 | 5/2002 | Smith, Jr. et al. |
| 6,419,801 | B1 | 7/2002 | Smith, Jr. et al. |
| 8,343,306 | B2 | 1/2013 | Tanaka et al. |
| 8,440,061 | B2 | 5/2013 | Valcore, Jr. et al. |
| 8,450,933 | B2 | 5/2013 | Nonomura et al. |
| 8,558,460 | B2 | 10/2013 | Nonomura et al. |
| 8,671,879 | B2 | 3/2014 | Qin et al. |
| 8,822,948 | B1 | 9/2014 | Hartwell |
| 9,627,186 | B2 | 4/2017 | Valcore, Jr. et al. |
| 10,121,708 | B2 | 11/2018 | Sakiyama et al. |
| 10,365,212 | B2 | 7/2019 | Kueny et al. |
| 10,748,797 | B2 | 8/2020 | Bhatia et al. |
| 12,322,582 | B2 | 6/2025 | Kapoor et al. |
| 12,340,992 | B2 | 6/2025 | Sakiyama et al. |
| 2002/0119660 | A1 | 8/2002 | Sarfaty et al. |
| 2003/0170984 | A1 | 9/2003 | Yamamoto et al. |
| 2003/0176074 | A1 | 9/2003 | Paterson et al. |
| 2003/0190761 | A1 | 10/2003 | Oluseyi |
| 2004/0021094 | A1 | 2/2004 | Johnson et al. |
| 2008/0061793 | A1 | 3/2008 | Anwar et al. |
| 2008/0246493 | A1 | 10/2008 | Gardner |
| 2009/0308840 | A1 | 12/2009 | Kohno et al. |
| 2010/0292951 | A1 | 11/2010 | Gaertner et al. |
| 2011/0215072 | A1 | 9/2011 | Park et al. |
| 2011/0265951 | A1 | 11/2011 | Xu et al. |
| 2012/0034844 | A1 | 2/2012 | Zhang et al. |
| 2012/0034845 | A1 | 2/2012 | Hu et al. |
| 2012/0037188 | A1 | 2/2012 | McCormick et al. |
| 2012/0096006 | A1 | 4/2012 | David et al. |
| 2012/0268738 | A1 | 10/2012 | David |
| 2013/0103347 | A1 | 4/2013 | Jun et al. |
| 2013/0104988 | A1 | 5/2013 | Yednak, III et al. |
| 2013/0323860 | A1 | 12/2013 | Antolik et al. |
| 2015/0131698 | A1 | 5/2015 | Vellore et al. |
| 2015/0241272 | A1 | 8/2015 | Lian et al. |
| 2015/0311129 | A1 | 10/2015 | Miller et al. |
| 2016/0064199 | A1 | 3/2016 | Valcore, Jr. et al. |
| 2016/0123898 | A1 | 5/2016 | Chen et al. |
| 2016/0379896 | A1 | 12/2016 | Asakura et al. |
| 2017/0141001 | A1 | 5/2017 | Sakiyama et al. |
| 2017/0200658 | A1 | 7/2017 | Yang et al. |
| 2017/0207070 | A1 | 7/2017 | Kabouzi et al. |
| 2017/0261312 | A1 | 9/2017 | Khandelwal et al. |
| 2017/0263478 | A1 | 9/2017 | McCHESNEY et al. |
| 2017/0304877 | A1 | 10/2017 | Hilkene et al. |
| 2018/0038800 | A1 | 2/2018 | Gamache |
| 2018/0040460 | A1 | 2/2018 | Gottscho |
| 2018/0082826 | A1 | 3/2018 | Guha et al. |
| 2018/0136118 | A1 | 5/2018 | Kueny et al. |
| 2018/0164092 | A1 | 6/2018 | Sasano et al. |
| 2018/0204750 | A1 | 7/2018 | Bhatia et al. |
| 2018/0252650 | A1 | 9/2018 | Morvay et al. |
| 2018/0269119 | A1 | 9/2018 | Coppa et al. |
| 2018/0286650 | A1 | 10/2018 | Bullock et al. |
| 2019/0085448 | A1 | 3/2019 | Phillips et al. |
| 2019/0120775 | A1 | 4/2019 | Sawlani et al. |
| 2019/0226913 | A1 | 7/2019 | Wang et al. |
| 2019/0252163 | A1 | 8/2019 | Gottscho |
| 2020/0013596 | A1 | 1/2020 | Yun |
| 2020/0105510 | A1 | 4/2020 | Yoshida et al. |
| 2020/0110390 | A1 | 4/2020 | Banna |
| 2020/0116570 | A1 | 4/2020 | Ahn |
| 2020/0373210 | A1 | 11/2020 | Chen et al. |
| 2020/0381278 | A1 | 12/2020 | Vellore et al. |
| 2021/0013074 | A1 | 1/2021 | Lee et al. |
| 2021/0074594 | A1 | 3/2021 | Park et al. |
| 2021/0270673 | A1 | 9/2021 | Thompson |
| 2021/0285822 | A1 | 9/2021 | Carcasi et al. |
| 2021/0296092 | A1 | 9/2021 | Koshimizu |
| 2021/0305074 | A1 | 9/2021 | Wang |
| 2021/0340669 | A1 | 11/2021 | Lindley et al. |
| 2022/0028713 | A1 | 1/2022 | Ummethala et al. |
| 2022/0037135 | A1 | 2/2022 | Kapoor et al. |
| 2022/0113198 | A1 | 4/2022 | Sheng et al. |
| 2022/0223389 | A1 | 7/2022 | Kim et al. |
| 2022/0359244 | A1 | 11/2022 | Wang |
| 2022/0406578 | A1 | 12/2022 | Sakiyama et al. |
| 2022/0413452 | A1 | 12/2022 | Shah et al. |
| 2023/0135167 | A1 | 5/2023 | Lapidot et al. |
| 2023/0153503 | A1 | 5/2023 | Moffatt et al. |
| 2023/0169641 | A1 | 6/2023 | Lee et al. |
| 2023/0236569 | A1 | 7/2023 | Zhang et al. |
| 2023/0377181 | A1 | 11/2023 | Lee |
| 2024/0234112 | A1 | 7/2024 | Danek et al. |
| 2024/0355600 | A1 | 10/2024 | Kapoor et al. |
| 2024/0410760 | A1 | 12/2024 | Leeser et al. |
| 2025/0140542 | A1 | 5/2025 | Sawlani et al. |
| 2026/0081125 | A1 | 3/2026 | Sawlani et al. |

FOREIGN PATENT DOCUMENTS

| | | | |
|---|---|---|---|
| CN | 103120032 | A | 5/2013 |
| CN | 105389289 | A | 3/2016 |
| CN | 105474378 | A | 4/2016 |
| CN | 112106182 | A | 12/2020 |
| CN | 112614928 | A | 4/2021 |
| CN | 113053716 | A | 6/2021 |
| EP | 1191569 | A2 | 3/2002 |
| JP | H05226296 | A | 9/1993 |
| JP | H08241865 | A | 9/1996 |
| JP | H10270426 | A | 10/1998 |
| JP | H11288921 | A | 10/1999 |
| JP | 2001319922 | A | 11/2001 |
| JP | 2003173973 | A | 6/2003 |
| JP | 2004281673 | A | 10/2004 |
| JP | 2006086325 | A | 3/2006 |
| JP | 2006507505 | A | 3/2006 |
| JP | 2006324316 | A | 11/2006 |
| JP | 2008263043 | A | 10/2008 |
| JP | 2014056825 | A | 3/2014 |
| JP | 2016038993 | A | 3/2016 |
| KR | 20080006750 | A | 1/2008 |
| KR | 20110122664 | A | 11/2011 |
| KR | 101091466 | B1 | 12/2011 |
| KR | 20120059561 | A | 6/2012 |
| KR | 20120127349 | A | 11/2012 |
| KR | 20130062791 | A | 6/2013 |
| KR | 20150124927 | A | 11/2015 |
| KR | 20160002142 | U | 6/2016 |
| KR | 20200035897 | A | 4/2020 |
| KR | 20210057181 | A | 5/2021 |
| KR | 20220095494 | A | 7/2022 |
| KR | 20230122030 | A | 8/2023 |
| TW | 201426854 | A | 7/2014 |
| TW | 201536116 | A | 9/2015 |
| TW | 202108816 | A | 3/2021 |
| WO | WO-2004048942 | A1 | 6/2004 |
| WO | WO-2012039867 | A1 | 3/2012 |
| WO | WO-2017209901 | A2 | 12/2017 |
| WO | WO-2021101993 | A1 | 5/2021 |
| WO | WO-2022132704 | A1 | 6/2022 |
| WO | WO-2022155635 | A1 | 7/2022 |

(56) References Cited

FOREIGN PATENT DOCUMENTS

WO WO-2023154663 A1 8/2023
WO WO-2024054380 A1 3/2024

OTHER PUBLICATIONS

International Preliminary Report on Patentability and Written Opinion dated Aug. 22, 2024 in PCT Application No. PCT/US2023/061947.
International Preliminary Report on Patentability and Written Opinion dated Jan. 11, 2024 in PCT Application No. PCT/US2022/073346.
International Preliminary Report on Patentability and Written Opinion dated May 10, 2024 in PCT Application No. PCT/US2022/078791.
International Preliminary Reporton Patentability dated Nov. 9, 2023, in PCT Application No. PCT/US2022/025811.
International Search Report and Written Opinion dated Aug. 9, 2022, in Application No. PCT/US2022/025811.
International Search Report and Written Opinion dated Dec. 18, 2023 in PCT Application No. PCT/US2023/031458.
International Search Report and Written Opinion dated Jun. 1, 2023, in Application No. PCT/US2023/061947.
International Search Report and Written Opinion dated Mar. 2, 2023 in PCT Application No. PCT/US2022/078791.
International Search Report and Written Opinion dated Nov. 3, 2022 in PCT Application No. PCT/US2022/073346.
U.S. Appl. No. 18/835,800, inventors Sawlani K, et al., filed Aug. 5, 2024.
Aharchi M., et al., "A Review on 3D Reconstruction Techniques From 2D Images," In Innovations in Smart Cities Applications Edition 3: The Proceedings of the 4th International Conference on Smart City Applications, 2020, pp. 1-15.
Bhat S.F., et al., "ZoeDepth: Zero-shot Transfer by Combining Relative and Metric Depth," 2023, pp. 1-20.
CN Office Action dated Feb. 27, 2025 in CN Application No. 202080080541.3, with English Translation.
CN Office Action dated Mar. 5, 2024 in CN Application No. 202080028432.7, with English Translation.
CN Office Action dated Sep. 28, 2023, in Application No. CN202080028432.7 with English translation.
De Aguiar M.A.P.F., "3D Reconstruction From Multiple RGB-D Images With Different Perspectives," 2015, pp. 1-58.
EP Extended European Search Report dated Apr. 25, 2025 in EP Application No. 22834438.8.
International Preliminary Report on Patentability and Written Opinion dated Jun. 12, 2025 in PCT Application No. PCT/US2023/081699.
International Preliminary Report on Patentability and Written Opinion dated Mar. 20, 2025 in PCT Application No. PCT/US2023/031458.
International Preliminary Report on Patentability dated Aug. 26, 2021 issued in Application No. PCT/US2020/017193.
International Preliminary Report on Patentability dated Jun. 2, 2022, in PCT Application No. PCT/US2020/061052.
International Search Report and Written Opinion dated Dec. 3, 2025 in PCT Application No. PCT/US2025/040758.
International Search Report and Written Opinion dated Dec. 16, 2025 in PCT Application No. PCT/US2025/042534.
International Search Report and Written Opinion dated Feb. 2, 2026 in PCT Application No. PCT/US2025/049337.
International Search Report and Written Opinion dated Mar. 11, 2021 issued in Application No. PCT/US2020/061052.
International Search Report and Written Opinion dated Mar. 18, 2025 in PCT Application No. PCT/US2024/050655.
International Search Report and Written Opinion dated Mar. 29, 2024 in PCT Application No. PCT/US2023/081699.
International Search Report and Written Opinion dated Sep. 8, 2025 in PCT Application No. PCT/US2025/031213.
International Search Report and Written Opinion dated Sep. 16, 2020 issued in Application No. PCT/US2020/017193.
Invitation to Pay Additional Fees dated Jan. 13, 2025 in PCT Application No. PCT/US2024/050655.
JP Office Action dated Jul. 8, 2025 in JP Application No. 2024-140548, with English Translation.
JP Office Action dated Jul. 30, 2024 in JP Application No. 2021-547159, with English Translation.
JP Office Action dated Mar. 19, 2024 in JP Application No. 2021-547159 with English translation.
JP Office Action dated Nov. 21, 2023 in JP Application No. JP2021-547159 with English translation.
Kang Z., et al., "A Review of Techniques for 3D Reconstruction of Indoor Environments," International Journal of Geo-Information, 2020, vol. 9 (5), 330, pp. 1-31.
KR Office Action dated Apr. 29, 2026 in KR Application No. 10-2025-7031746, with English Translation.
KR Office Action dated Nov. 18, 2025 in KR Application No. 10-2022-7020890, with English Translation.
KR Office Action dated Nov. 26, 2025 in KR Application No. 10-2022-7045900, with English Translation.
KR Office Action dated Oct. 31, 2025 in KR Application No. 10-2024-7003718, with English Translation.
KR Office Action dated Sep. 28, 2024 in KR Application No. 10-2021-7029310 with English Translation.
SG Written Opinion dated Apr. 21, 2023 in Application No. SG11202108726S.
SG Written Opinion dated Apr. 23, 2024 in SG Application No. 11202108726S.
SG Written Opinion dated Nov. 7, 2025 in SG Application No. 11202400024U.
TW Office Action and Search Report dated Aug. 1, 2025 in TW Application No. 111115614, with English Translation.
TW Office Action and Search Report dated Nov. 27, 2025 in TW Application No. 114104803, with English Translation.
TW Office Action dated Feb. 26, 2026 in TW Application No. 111124716, with English Translation.
TW Office Action dated Jan. 10, 2024 in TW Application No. 109104147, with English Translation.
U.S. Corrected Notice of Allowance dated Jun. 2, 2025 in U.S. Appl. No. 17/756,081.
U.S. Corrected Notice of Allowance dated May 2, 2025 in U.S. Appl. No. 17/310,574.
U.S. Corrected Notice of Allowance dated May 9, 2025 in U.S. Appl. No. 17/310,574.
U.S. Non-Final Office Action dated Mar. 19, 2026 in U.S. Appl. No. 18/572,075.
U.S. Non-Final Office Action dated Nov. 7, 2024 in U.S. Appl. No. 17/756,081.
U.S. Non-Final Office Action dated Nov. 16, 2023 in U.S. Appl. No. 17/310,574.
U.S. Notice of Allowance dated Apr. 8, 2024 in U.S. Appl. No. 17/310,574.
U.S. Notice of Allowance dated Feb. 26, 2025 in U.S. Appl. No. 17/756,081.
U.S. Appl. No. 19/134,666, inventors Yee B et al., filed May 30, 2025.
U.S. Restriction Requirement dated Sep. 12, 2024 in U.S. Appl. No. 17/756,081.
International Search Report and Written Opinion dated Jun. 12, 2026 in PCT Application No. PCT/US2026/014666.
JP Office Action dated May 12, 2026 in JP Application No. 2023579660, with English Translation.
KR Office Action dated Jun. 15, 2026 in JP Application No. 10-2024-7017751, with English Translation.
TW Office Action and Search Report dated Jul. 29, 2026 in TW Application No. 111140840, with English Translation.
U.S. Final Office Action dated Jul. 15, 2026 in U.S. Appl. No. 18/572,075.
U.S. Notice of Allowance dated Jul. 1, 2026 in U.S. Appl. No. 18/761,206.

APPARATUSES FOR MEASURING GAP BETWEEN A SUBSTRATE SUPPORT PLANE AND GAS DISTRIBUTION DEVICE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

High-performance deposition and etch processes are important to the success of many semiconductor processing workflows. However, monitoring and measuring various components and aspects of the processing chamber that can affect such processes can be difficult, time-consuming, and oftentimes do not provide results with enough accuracy or precision to allow informed decisions to be made or corrective actions, if needed, to be taken in order to maintain or improve process quality or yield. Additionally, many techniques are unable to provide for in situ measuring of processing chamber components, and those that are able provide only limited information.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

Some aspects provide apparatuses capable of enabling the measurement of various characteristics of a showerhead-substrate gap in a processing chamber, including at high temperatures and at low-light conditions, using an imaging system external to the processing chamber.

Additional aspects will be set forth in the detailed description which follows, and, in part, will be apparent from the disclosure, or may be learned by practice of the inventive concepts.

According to some embodiments, an apparatus includes a carrier structure sized to be placed within a semiconductor processing chamber such that at least three locations on the carrier structure are interposed between a pedestal of the semiconductor processing chamber and a showerhead disposed above the pedestal. Each of the at least three locations has a corresponding first component and a corresponding second component. The first component at each location is movable at least along a first axis relative to the second component at that location and relative to the carrier structure. The first component at each location is supported relative to the carrier structure in at least one direction by at least one corresponding compliant member that is configured to apply a biasing force to that first component that urges that first component into a corresponding first position relative to the carrier structure. An outer surface of the first component has first optical properties and an outer surface of the second component has second optical properties. The first optical properties and the second optical properties have high optical contrast with respect to one another. The first component and the second component at each location are arranged such that when the first component is moved relative to the carrier structure along the first axis, an amount of the first component obscured by the second component when viewed along an axis perpendicular to the first axis changes.

In some embodiments, the carrier structure may have a corresponding interface feature at each location, each interface feature may have a corresponding opening, each first component may be a pin having a head and a shaft arranged along a center axis, the head of each pin may have a larger cross-sectional area in a first plane perpendicular to the center axis of that pin than a cross-sectional area of the shaft of that pin in a second plane perpendicular to the center axis of that pin, each second component may have a corresponding wall portion and a corresponding flange portion, the wall portion of each second component may be sized and positioned so as to protrude through the opening of the interface feature at the location having that second component and such that the flange portion of that second component is in contact with a first surface of that interface feature, and the shaft of the pin at each location may pass through an aperture formed, at least in part, by a surface of the second component at that location and a second surface of the carrier structure at that location.

In some embodiments, the at least one compliant member at each location may be a spring that supports the pin at that location at least when the apparatus is oriented such that the head of that pin is directly above the shaft of that pin.

In some embodiments, the spring at each location may support the pin at that location at least when the apparatus is oriented such that the head of that pin is directly above the shaft of that pin and such that the shaft of that pin protrudes from the carrier structure to a greater extent than the wall portion of the second component at that location when the flange portion of that second component is in contact with the first surface of the interface feature at that location.

In some embodiments, each spring may have an outer ring, an inner ring, and a circular array of multiple flexure elements that each extend from the outer ring to the inner ring along a spiral path.

In some embodiments, the opening of each interface feature and the wall portion of the second component that protrudes therethrough may be shaped and sized such that when the flange portion of that second component is in contact with the first surface of that interface feature, the second component is substantially prevented from moving laterally relative to the carrier structure.

In some embodiments, the wall portion of each second component may have an annulus sector-shaped cross-section in a plane perpendicular to the center axis of the pin, and the flange portion of each second component may have one or more arcuate outermost surfaces that each have a center point that is concentric with a center point of the annulus sector-shaped cross-section of the wall portion of that second component.

In some embodiments, for each location: the shaft of the pin for that location may have a first shaft portion having a first radius $r_1$ and a second shaft portion having a second radius $r_2$, the wall portion of the second component for that location may have an outermost surface that is offset from a surface of the opening facing the wall portion at that location by a distance x in a direction that radiates outward from the center point of the annulus sector-shaped cross-section of that wall portion, $r_2$ may be greater than $r_1$, and x may be greater than $$\sqrt{r_2^2 - r_1^2}.$$

In some embodiments, the carrier structure may have a ring-like shape, the at least three locations may include a first set of three locations, and the locations in the first set of three locations may be spaced apart from one another about the carrier structure.

In some embodiments, the at least three locations may further include a second set of three locations, and the locations in the second set of three locations may be spaced apart from one another about the carrier structure and apart from the locations in the first set of three locations.

In some embodiments, the locations in the first set of three locations and the second set of three locations may be arranged about a common center point, the locations in the first set of three locations may be arranged such that a) a first reference axis that extends through a location in the first set of three locations and through the common center point intersects with a first reference point and b) distances between the first reference point and each of the other two locations in the first set of three locations are equal, and the locations in the second set of three locations may be arranged such that a) a second reference axis, perpendicular to the first reference axis, that extends through a location in the second set of three locations and through the common center point intersects with a second reference point and b) distances between the second reference point and each of the other two locations in the second set of three locations are equal.

In some embodiments, the first optical properties may include a light-colored material and the second optical properties may include a dark-colored material.

In some embodiments, the first optical properties may include white material and the second optical properties may include black material.

According to some embodiments, an apparatus includes a carrier structure sized to be placed within a semiconductor processing chamber such that at least three locations on the carrier structure are interposed between a pedestal of the semiconductor processing chamber and a showerhead disposed above the pedestal. Each of the at least three locations has a corresponding first component having a corresponding contact surface and a corresponding first reference surface. The contact surface and the reference surface for each first component are parallel to one another. Each of the first components is connected with the carrier structure by a corresponding first flexure structure and a corresponding second flexure structure that are each pivotally connected with the carrier structure at a first end and pivotally connected with the corresponding first component at a second end opposite the first end. The first flexure structure and the second flexure structure that are pivotally connected with each first component are configured to constrain movement of that first component such that the contact surface thereof does not experience a substantial change in angular orientation during movement of the first component from a first position relative to the carrier structure to a second position relative to the carrier structure. At least one of the first flexure structure and the second flexure structure for each first component includes a first trigger structure that is configured to protrude beyond a bottom surface of the carrier structure when that first component is in the first position relative to the carrier structure and that is further configured to be coincident with, but not pass through, a plane coincident with the bottom surface of the carrier structure when that first component is in the second position relative to the carrier structure.

In some embodiments, the apparatus may further include one or more second reference surfaces that are fixed in space with respect to the carrier structure and positioned such that when the first components are in the second configuration a gap is visible between the first reference surfaces and the one or more second reference surfaces when viewed along a direction parallel to the one or more second reference surfaces.

In some embodiments, each of the at least three locations may have a corresponding second component having a corresponding second reference surface, each of the second components may be connected with the carrier structure by a third flexure structure and a fourth flexure structure that are each pivotally connected with the carrier structure at a first end and pivotally connected with the corresponding second component at a second end opposite the first end, the third flexure structure and the fourth flexure structure that are pivotally connected with each second component may be configured to constrain movement of that second component such that the second reference surface thereof does not experience a substantial change in angular orientation during movement of the second component from a third position relative to the carrier structure to a fourth position relative to the carrier structure, at least one of the third flexure structure and the fourth flexure structure for each second component may include a second trigger structure that is configured to protrude beyond the bottom surface of the carrier structure when that second component is in the third position relative to the carrier structure and that may be further configured to be coincident with, but not pass through, the plane coincident with the bottom surface of the carrier structure when that second component is in the fourth position relative to the carrier structure, and the second components may be closer to the carrier structure than the contact surfaces of the first components when the first components are each in the second position and the second components are each in the fourth position.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Figure 1:
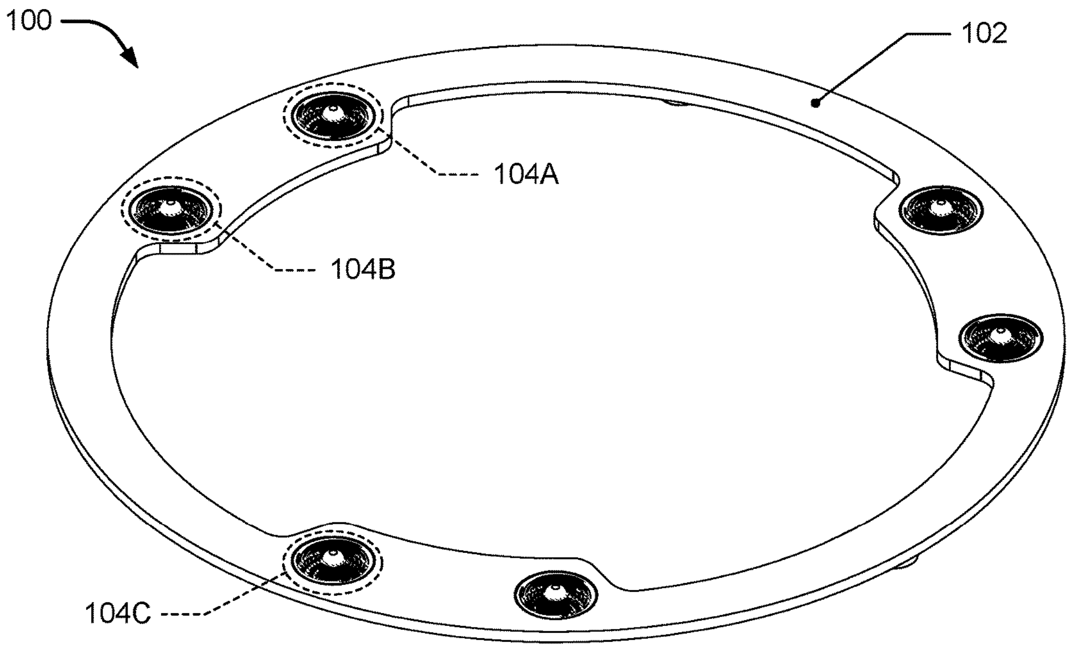
FIG. 1 depicts an example apparatus 100 that includes a carrier structure with a plurality of locations.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "semiconductor wafer," "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

Introduction and Context

For many semiconductor processes, the space between a wafer and a gas distribution device, e.g., a showerhead, can greatly affect numerous aspects of the processing performed on the wafer. For example, the size and shape of this space can affect gas flow characteristics from the showerhead to the wafer, e.g., gas flowrate and uniformity, which can impact the effects of the gas on the wafer, such as adsorption, deposition uniformity or rate, or etch rate. In other instances, the size and shape of this space can affect heat transfer between the wafer and other components of the processing chamber, such as the showerhead or a substrate support that supports the substrate, e.g., a pedestal or electrostatic chuck ("ESC"), which may also affect the processing performed on the wafer. The size and shape of this space may also affect aspects of a plasma generated within that space, such as plasma field density and/or distribution. The present inventors determined that it would be desirable to be able to quantify the nature of the space, or "gap," between the substrate and the gas distribution device, e.g., as represented by the distance between the plane at which the substrate is supported (hereinafter "substrate support plane") and the showerhead (or gas distribution device) above the substrate; this gap between the substrate support plane and the showerhead is referred to herein as the "showerhead-substrate gap" or "gap". Quantifying the nature of the showerhead-substrate gap may allow adjustments to be made, if necessary, to the height of the substrate and/or the orientation of the showerhead in order to achieve a desired relative positioning and orientation between the showerhead and the substrate. This gap may also, in effect, be determinative of the distance between the showerhead and other components and features below the showerhead, such as the substrate support, the substrate, if present, and the carrier structure, for example.

For example, in some semiconductor processing tools, the showerhead may be connected with the semiconductor processing tool by leveling supports that may be individually adjusted so as to cause the orientation and/or vertical position of the showerhead relative to the semiconductor processing chamber to be fine-tuned. In such systems, it may, for example, be desirable to adjust the orientation of the showerhead such that the underside thereof is nominally parallel to substrates positioned therebeneath. In order to determine what adjustments to make to such a showerhead in order to achieve such an alignment, a determination must first be made as to what the pre-adjustment orientation or alignment of the showerhead to the substrate actually is.

It is further desirable to evaluate this space while the processing chamber is at or within the operating temperature or operating temperature ranges instead of at ambient, room temperature. Many semiconductor processing operations are performed at temperatures higher than ambient, room temperatures (e.g., about 20° C.), including high temperatures over 200° C., 300° C., 400° C., 500° C., or 600° C., for example. Thermal expansion at these high temperatures may cause various components inside the processing chamber to shift position and/or change size, shape, or distance between components, including the showerhead-substrate gap, as compared to at non-operating, room temperatures. For instance, at room temperature, the showerhead and substrate may have a particular alignment and separation distance, but at elevated operating temperatures, they may have a different alignment and separation distance, such as one surface having a different tilt, different surface shape, or different separation distance. Because of this, measurements taken at ambient, room temperature may be different than measurements taken at these higher operating temperatures and using such room temperature measurements as the basis for adjustment may result in a showerhead that is not positioned relative to a substrate located therebeneath in the desired location during actual wafer processing operations.

It is also desirable to provide highly accurate measurements of the gap because such higher accuracy can lead to more uniformly processed wafers. The processing chamber components and conditions can be more tightly controlled and adjusted with these higher accuracy measurements which can lead to achieving desired processing conditions and results, and reduced non-uniformity on wafers, including reduced station-to-station nonuniformity.

The present inventors determined that obtaining such measurements optically, e.g., using cameras/image sensors positioned outside of the semiconductor processing chamber, would potentially allow for such measurements to be reliably and accurately made. Such imaging sensors may be positioned so as to be able to observe various points within the semiconductor processing chamber through viewports in the semiconductor processing chamber walls while the semiconductor processing chamber was at elevated, process-level temperatures. For example, achieving the desired process-level temperatures within the semiconductor processing chamber may involve generating a plasma within the semiconductor processing chamber. Using imaging sensors allows for the sensors in question to be positioned outside of the chamber, thus preventing the imaging sensors from being damaged by the plasma.

Apparatuses

Aspects of this disclosure pertain to apparatuses with stationary and movable components that enable the measurement of various characteristics of a showerhead-substrate gap in a processing chamber, including at high temperatures and at low-light conditions, using an imaging system that is external to the processing chamber. The apparatuses may be positioned in processing chambers, e.g., supported by a pedestal or ESC thereof, and may provide reference and movable measurement surfaces that are configured to be visible to one or more imaging sensors positioned outside the processing chamber. The carrier structure includes a plurality of measurement locations that each have a reference component (also referred to herein as a stationary component) with a corresponding reference surface that is stationary relative to the carrier structure, and a moveable component with a corresponding measurement surface that is moveable relative to the reference component. As the showerhead and substrate support are moved closer to each other and the showerhead-substrate gap decreases, the moveable component is contacted by the showerhead and moved relative to the reference component, thereby resulting in relative movement between the corresponding reference surface and measurement surface. This relative movement may be caused by movement of the substrate support, showerhead, or both.

The moveable component may be supported in a first position by a compliant member, such as a spring or a flexure structure that has elastic properties configured to support the moveable component, deform when force is applied to the movable component, and exert a force on the movable component to return it to the first position when the force is removed. As the moveable component is moved along an axis relative to the stationary component to a different position, the compliant member exerts a force against the moveable component that urges the moveable component to return to the first position.

The distance between the measurement and reference surfaces of the moveable and stationary components, respectively, is detectable by the imaging system and can be used, in conjunction with other information (such as the dimensions of the apparatus and the reported elevation of the wafer support) to determine the distance between the substrate and the showerhead at the location of the movable component. By obtaining multiple, e.g., three, such measurements, it is possible to obtain information sufficient to allow the orientation and position of the underside of the showerhead to be determined relative to the wafer support. In some instances, the moveable and stationary components have optical properties that have a high optical contrast with each other, such as black and white surfaces. These optical properties enable the detection of these surfaces in different lighting conditions, including low light. In some implementations, an inert plasma may be generated within the processing chamber to provide light and to generate heat used to achieve process-level temperatures. Further, the apparatuses may be made of materials that are capable of withstanding and functioning in high temperatures, such as over 200° C., 300° C., 400° C., 500° C., or 600° C., for example.

FIG. 1 depicts an example apparatus 100 that includes a carrier structure with a plurality of locations, or measurement locations. Each location has a first component and a second component. In this implementation, the carrier structure 102 includes a total of six locations 104, three of which are identified within circles 104A through 104C. The carrier structure is configured to be placed within a semiconductor processing chamber such that at least three of the locations 104 are interposed between a substrate support, e.g., a pedestal, and a gas distribution device, e.g., a showerhead. For instance, the substrate support may have a support outer diameter or perimeter, the showerhead may have a showerhead outer diameter or perimeter, and the carrier structure may be sized such that when it is positioned on the substrate support, at least three of the locations 104 may be positioned within a circle having a diameter less than the showerhead outer diameter and the support outer diameter and therefore interposed between the substrate support and the showerhead.

Figure 2:
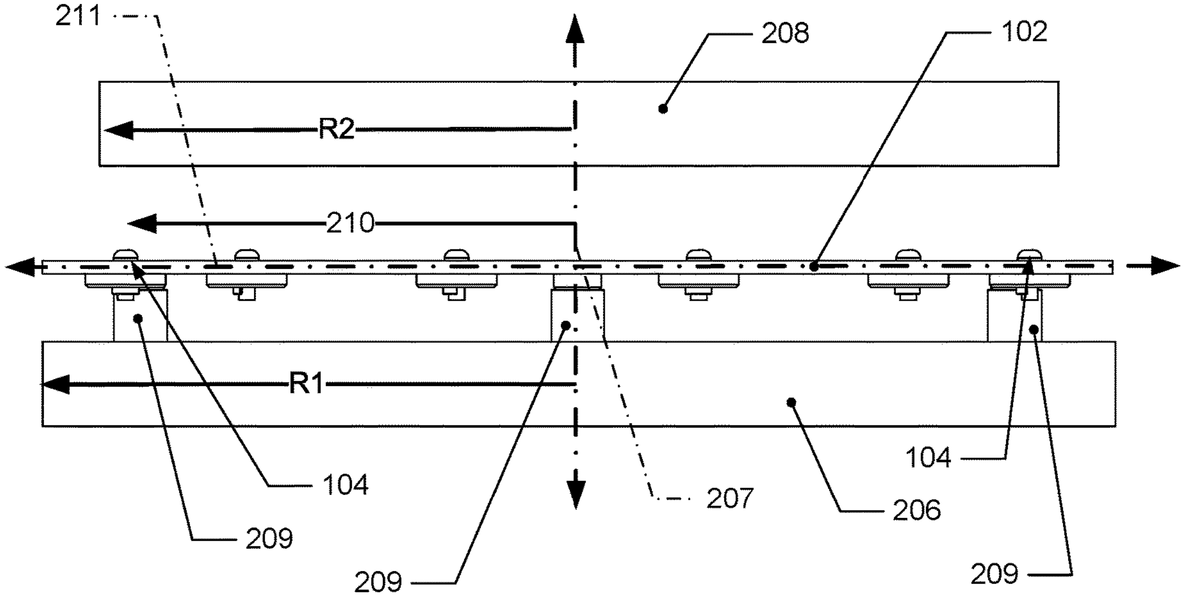
FIG. 2 depicts a side view schematic of the apparatus of FIG. 1, a substrate support, and a showerhead.

This is illustrated in FIG. 2 which depicts a side view schematic of the apparatus of FIG. 1, a substrate support, and a showerhead. The substrate support 206 and the showerhead 208 are representationally illustrated as rectangles. As can be seen, the carrier structure 102 is configured such that when it is positioned on a substrate support 206, at least three of the locations 104 are interposed between the substrate support 206 and the showerhead 208. This may include spacing one or more of the locations 104 from a center point 207 of the carrier structure 102 by a radial distance 210 less than the radius R1 of the substrate support 206 and the radius R2 of the showerhead 208.

It should be noted that the substrate support 206 in this example is a substrate support for use in a backside wafer deposition processing chamber. In such systems, the substrate support is actually a second showerhead that is positioned to flow gas upwards towards the underside of the substrate as opposed to downwards towards the top side of the substrate. The substrate itself may be supported by a ring structure—similar in shape, for example, to the carrier structure 102—that is, in turn, held aloft above the second showerhead by a plurality of risers 209 that may be located around the perimeter of the second showerhead. A plane 211 is shown in FIG. 2 to represent the plane at which a substrate is supported, i.e., the substrate support plane, by the substrate support 206. The carrier structure 102 may therefore be positioned so that it represents the substrate support plane 211. In such a configuration, there will be a gap between the underside of the substrate and the surface of the substrate support/second showerhead immediately below the substrate, as well as another gap between the top side of the substrate and the underside of the showerhead 208. Thus, the wafer support plane of the substrate support may actually be elevated above the upper surface of the second showerhead.

The carrier structure 102 may be made of a material that can withstand high temperatures, such as over 200° C., 300° C., 400° C., 500° C., or 600° C., for example, while still remaining dimensionally stable. The material may, for example, be a ceramic, such as aluminum oxide or a similar material.

Figure 3:
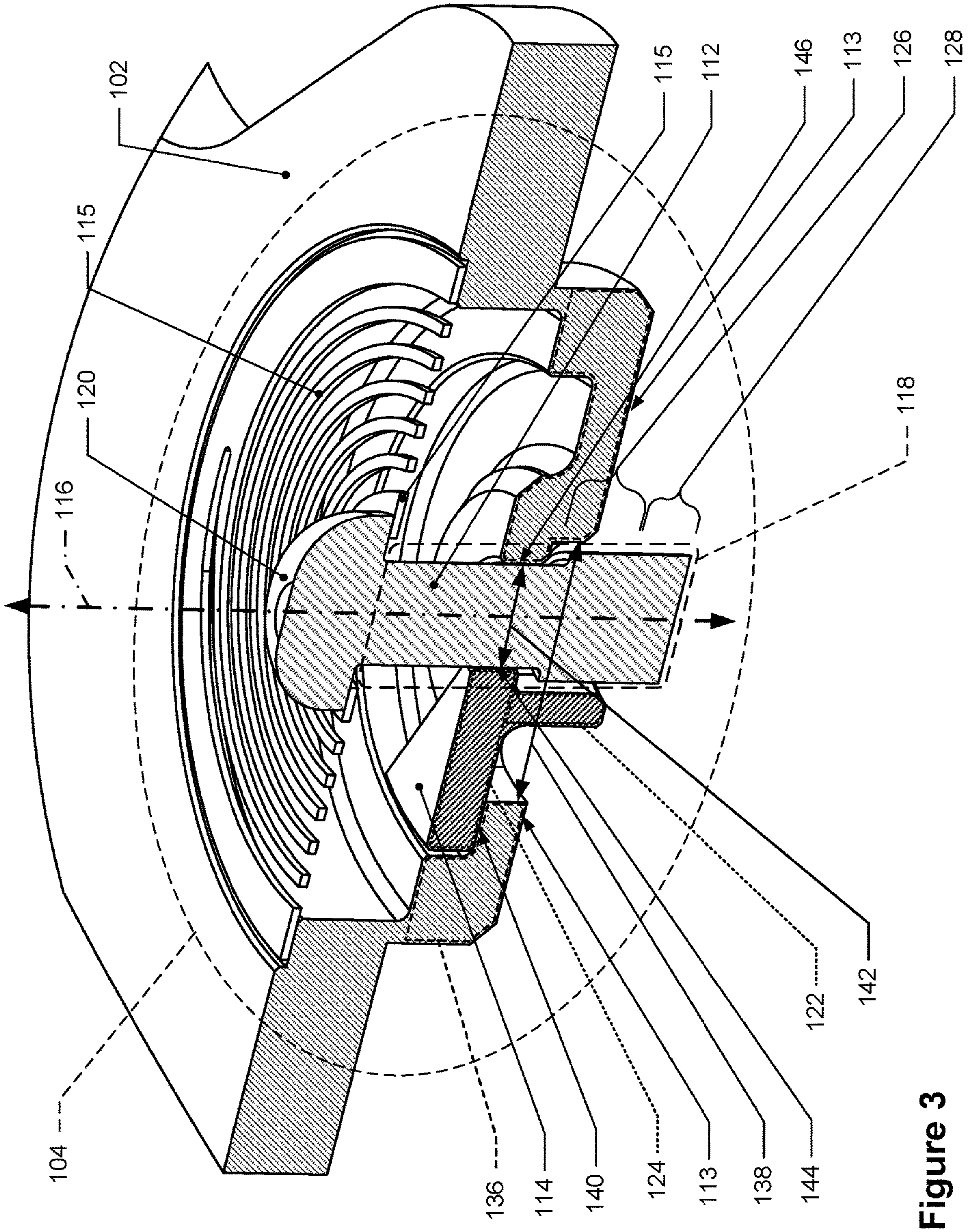
FIG. 3 depicts a magnified, cross-sectional off-angle view of a first component and a second component at one location of the carrier structure of FIG. 1.

Each location 104 of the of the carrier structure may include a first component and a second component, with the first component being moveable relative to the second component. These features are not fully visible in FIGS. 1 and 2 but are shown in FIG. 3 which depicts a magnified, cross-sectional off-angle view of a first component and a second component at one location 104 of the carrier structure of FIG. 1. Here, portions of the carrier structure 102, one location 104, a first component 112, and a second component 114 are seen. The illustrated first component 112 and the second component 114 both have portions that extend through the carrier structure 102 and below a bottom surface 113 of the carrier structure 102, thereby allowing those portions to be visible when the carrier structure is viewed from the side, such as along a horizontal direction. With surfaces of such portions visible to the imaging system, the displacement or relative positioning of the first component 112 relative to the second component 114 may be detected and measured.

In some implementations, the second component 114 may obscure some of the first component 112 and as the first component 112 is moved relative to the second component, the amount that the first component 112 is obscured by the second component 114 changes. In FIG. 3, the first component 112 includes a shaft 118 and a head 120 centered on axis 116. The second component 114 includes a wall portion 122 and a flange portion 124. The wall portion 122 of the second component 114 and the shaft 118 of the first component 112 extend through an opening in the carrier structure 102 and below the bottom surface 113 of the carrier structure 102 such that they may both be visible when the carrier structure is viewed along a direction perpendicular to the axis 116. The first component 112 is shown held in a first position by a compliant member 115 such that one portion 126 of the shaft 118 may be obscured by the wall portion 122 and another portion 128 of the shaft 118 extends past the wall portion 122 and may be visible.

Figure 4A:
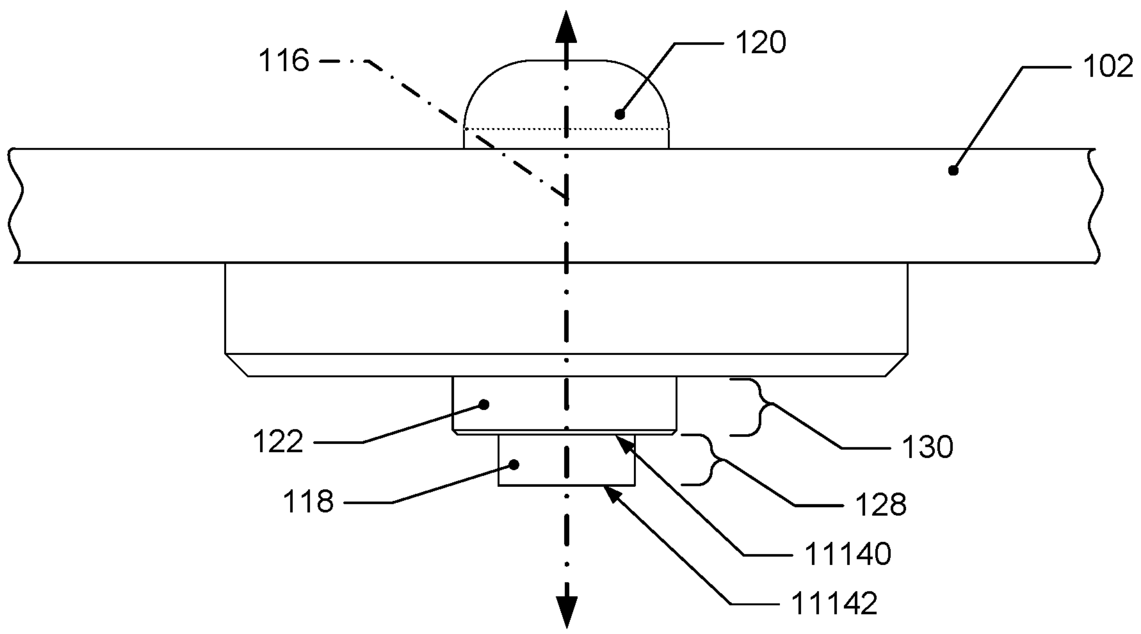
FIG. 4A depicts a magnified side view of one location of the apparatus of FIG. 2 with a first component in a first position.

The first component 112 is movable at least along axis 116 relative to the second component 116, thereby allowing the amount of the shaft 118 obscured by the wall portion 122 to change as the first component 112 is moved relative to the second component 114. The change in how much of the shaft 118 is obscured by the wall portion 122 is illustrated with FIGS. 4A-5B. FIG. 4A depicts a magnified side view of one location of the apparatus of FIG. 2 with a first component in a first position. Here, the view is along an axis perpendicular to the axis 116 illustrated in 3 and/or parallel to a wafer support plane of the substrate support. The carrier structure 102 is seen along with the head 120 and section 128 of the shaft 118 of the first component 112, the axis 116, and a visible portion 130 of the wall portion 122 of the second component 114 that obscures some of the shaft 118 of the first component 112 and does not obscure the other section 128 of the shaft 118 of the first component 112.

Figure 4B:
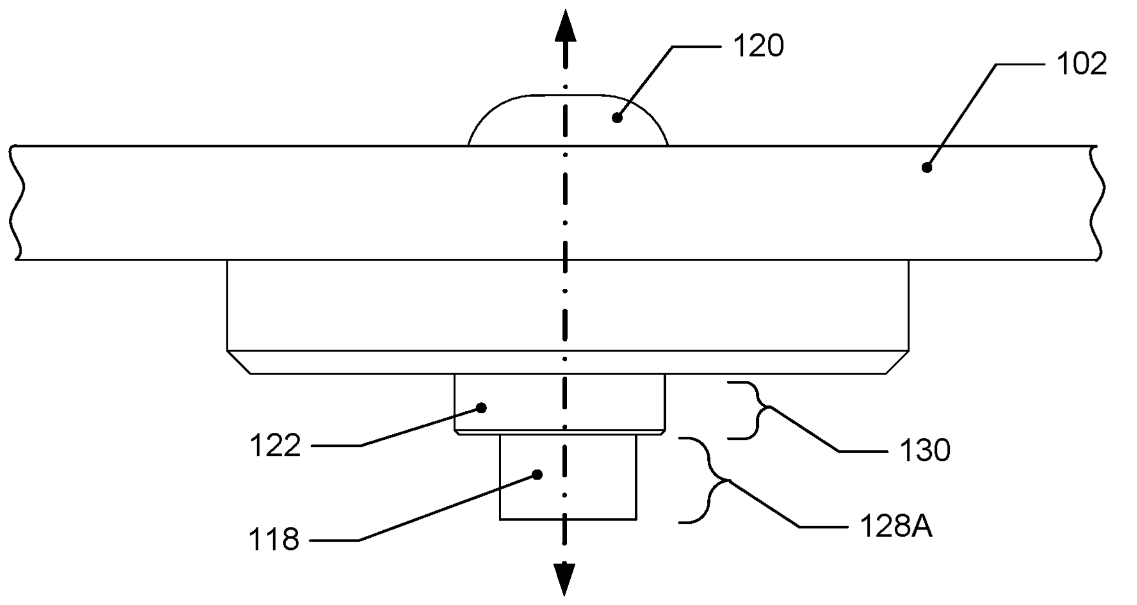
FIG. 4B depicts the magnified side view of FIG. 4A, but with the first component in a second position.

As the first component 112 is moved relative to the second component 114, the amount of the first component that is obscured by the second component 114 changes, such as section 128 increasing or decreasing in size. FIG. 4B depicts the magnified side view of FIG. 4A, but with the first component in a second position. Here, the first component 112 is in a different, second position relative to the second component 114, and relative to the carrier structure 102. The movement of the first component 112 is along axis 116 and the section 128A of the first component 112 visible here is larger than the section 128 in FIG. 4A. The amount of the first component 112 obstructed by the second component 114 has therefore changed between FIGS. 4A and 4B. The visible portion of the first component 112, along with the changes to this visible portion, such as sections 128 and 128A in FIGS. 4A and 4B, are detectable to the imaging system that is used to measure various aspects of the processing chamber, including the distance between the showerhead and substrate support.

The optical properties of the first and second components may be selected to enhance optical contrast between the two components to allow the relative positions of various fiducial features on the first and second components to be reliably detected in images thereof taken by the imaging system under low-light conditions, e.g., such as during illumination by a plasma that may be generated within the processing chamber. In some embodiments, this may include an outer surface of the first component having first optical properties and an outer surface of the second component having second optical properties that result in such surfaces having high optical contrast with respect to each other. In some implementations, the first optical properties may be provided by the first component having an outer surface or surfaces made of a light-colored material, e.g., a white material, and the second optical properties may be provided by the second component having an outer surface or surfaces made of a dark-colored material, such as a black material. As noted above, this high optical contrast may assist with imaging the first and second components in low light conditions within the processing chamber, including while an inert plasma is generated to produce some light. In particular, such high optical contrast may allow the amount of the first component that is not masked by the second component to be more readily ascertained from an image taken of the first component and the second component during low-light conditions.

Further, the first and second components may, similar to the carrier structure, be made of one or more materials that are configured to withstand high temperatures, including above 200° C., 300° C., 400° C., 500° C., or 600° C., for example. In some embodiments, the first and second components may be made of ceramics and/or quartz materials, e.g., the first component may be made of Heraeus OM® 100, an opaque, high-purity white quartz, and the second component may be made of Heraeus HBQ® 100, an opaque, high-purity black quartz. Other materials offering similar high-contrast optical properties and stability at in the thermal environments discussed above may be used as well.

Referring back to FIG. 3, the first component 112 is movable at least along the axis 116 relative to the second component 116. The movability of the first component 112 is enabled, at least in part, by the compliant member 115 that supports the first component 112. Without external forces acting on the first component 112 (other than gravity and/or forces exerted on the first component 112 by the carrier structure 102 and/or the second component 114), the compliant member 115 is configured to support the first component 112 in a first position, as depicted in FIG. 3. This support by the compliant member 115 may be provided when the apparatus 100 is oriented such that the head 120 of the first component 112 is directly above the shaft 118, as further depicted in FIG. 3. The compliant member 115, such as a spring or flexure, may have elastic properties that exert one or more forces on the first component 112. These one or more forces may hold and support the first component 112 in the first position and may cause the first component 112 to return to the first position when the first component 112 is moved out of the first position and the additional force causing such movement is then removed. The one or more forces may be exerted in at least a direction parallel to the axis 116.

Figure 5A:
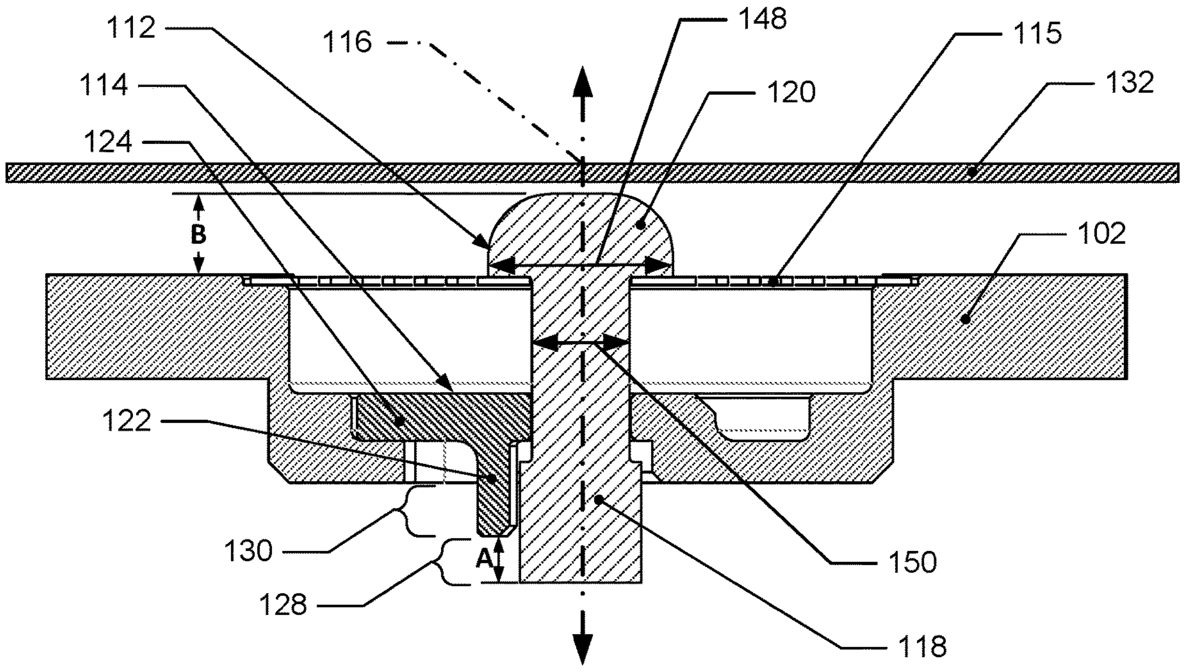
FIG. 5A depicts a magnified cross-sectional side view of the portion of apparatus of FIG. 3 with the first component in a first position.
Figure 5B:
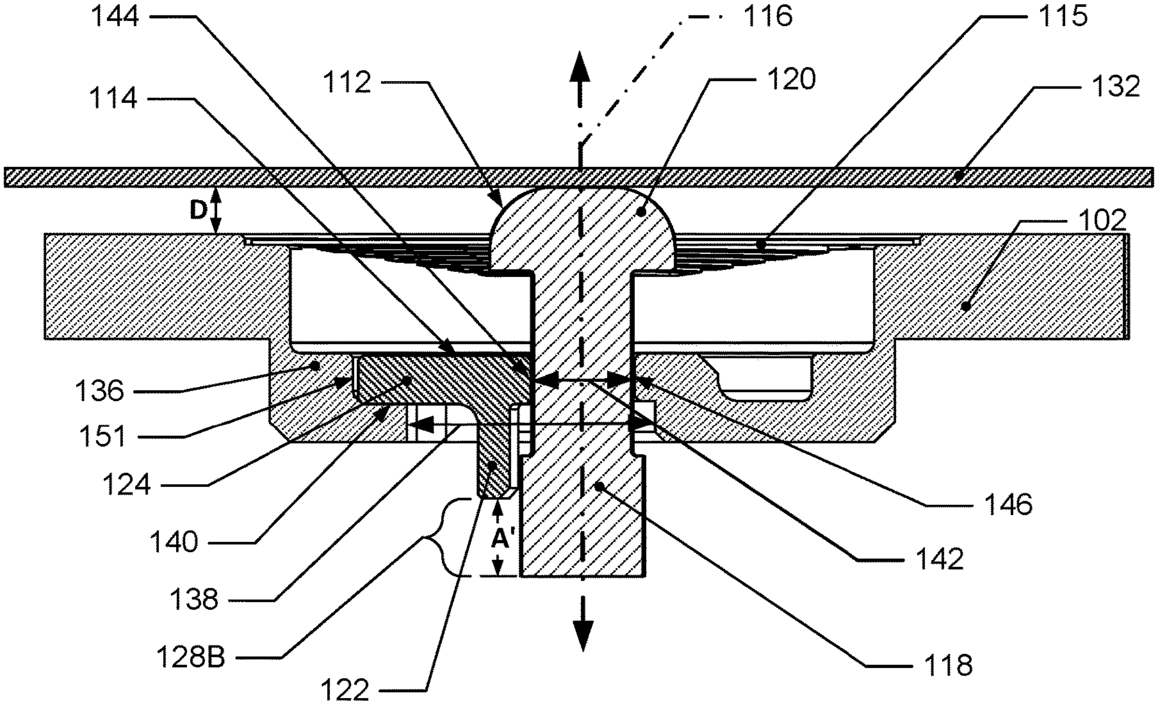
FIG. 5B depicts the magnified cross-sectional side view of FIG. 5A, but with the first component in a second position.

Additional illustrations of the relative movement between the first and second components are seen in the cross-sectional views of FIGS. 5A and 5B. Similar to FIGS. 4A and 4B, FIGS. 5A and 5B are viewed along an axis perpendicular to the axis 116 illustrated in 3 and/or parallel to a wafer support plane of the substrate support. FIG. 5A depicts a magnified cross-sectional side view of the portion of apparatus of FIG. 3 with the first component in a first position. The first component 112 is supported by the compliant member 115 with the head 120 over the shaft 118 of the first component. The section 128 of the shaft 118 is unobstructed by the wall portion 122 of the second component 114 and the second 130 of the shaft 118 is obstructed by the wall portion 122. The compliant member 115 is also seen supported by the carrier structure 102. The head 120 of the first component 112 is depicted in contact with a surface 132 that may represent the showerhead or gas distribution device forming the upper surface of the gap.

FIG. 5B depicts the magnified cross-sectional side view of FIG. 5A, but with the first component in a second position. Here, the first component 112 has been moved relative to second component 114 to a second position such that more of the shaft 118 is visible; this is identified as 128B like in FIG. 4B. The amount the first component 112 has been obstructed between the first and second positions illustrated in FIGS. 5A and 5B has changed. Similar to above, the visible sections 128 and 128A in FIGS. 5A and 5B and their different sizes are detectable to the imaging system and what may be used to measure various aspects of the processing chamber, including the distance between the showerhead and substrate support. The compliant member 115 is also seen in a deformed, stretched, or extended state which may exert the one or more forces against the first component to return it to the first position of FIG. 5A. At least one of these forces may have a directional component that is parallel to the axis 116 to move the first component back to the first position of FIG. 5A.

As noted herein, the movement of the first component 112 may be characterized by its relative movement with respect to the second component 114. This relative movement may be caused by movement of the carrier structure 102 (which may be caused by movement of the substrate support on which the carrier structure 102 is placed), the surface 132 (e.g., a showerhead), or both. In some implementations, the first component 112 may remain stationary while the carrier structure 102 and second component 114 are moved vertically in space, such as with respect to the bottom of the processing chamber. For example, the carrier structure 102 may be placed on a pedestal and the pedestal may be moved vertically upwards. At some point, the first component 112 contacts a stationary showerhead (e.g., surface 132) above the pedestal and the pedestal continues to move upwards thereby causing the carrier structure 102 and the second component 114 to move vertically upwards in space while the first component 112 remains stationary.

In another implementation, the first component 112 may be moved in space by a structure, such as a showerhead (e.g., surface 132), while the carrier structure 102 and second component 114 remain stationary. For instance, the carrier structure 102 may be placed on a pedestal below a showerhead (e.g., surface 132), and the showerhead may be moved vertically downwards. At some point, the showerhead contacts the first component 112 and continues moving downwards and thereby moving the first component 112 downwards while the carrier structure 102 and the second component 114 remain stationary. In other implementations, both the pedestal and showerhead may move and thereby move both the first component 112 and second component 114 in space.

For example, the amount of each first component 112 that extends beyond the corresponding second component 114 when that first component is not being subjected to external loading, e.g., by being pushed into contact with the underside of the showerhead 208, may be a known quantity (A). Similarly, the amount that each first component extends above, for example, the uppermost surface of the carrier structure 102 under such conditions may also be a known quantity (B). Thus, when the carrier structure 102 is, for example, raised such that multiple first components 112 are caused to contact the surface 132, each first component 112 that contacts the surface 132 will be displaced downwards by some small amount relative to the carrier structure 102, thereby causing a change in the amount that each first component 112 extends beyond the corresponding second component 114. Using this information, the gap distance (D) between the surface 132 and, for example, the uppermost surface of the carrier structure 102 at each location having a first component may be easily determined by subtracting the change in the amount (A) that the first component 112 at that location extends beyond the corresponding second component 114 (e.g., A' minus A) from the amount (B) that that first component extended beyond the uppermost surface of the carrier structure prior to contacting the surface 132.

The different distances D, for example, determined for each location subject to measurement may, for example, provide information that allows at least the angle formed between the underside of the showerhead and the top of the carrier structure to be determined. The carrier structure may, for example, serve as a proxy for the substrate that would normally be present and supported by a somewhat similar carrier structure during wafer processing operations (although such a carrier structure would likely omit the first/second components and associated features/hardware). For example, if the distances D are all the same, then a determination can be made that the underside of the showerhead is parallel to the top surface of the carrier structure. However, if one or more of the distances D differ from the other distance(s) D, then those distances D a) indicate that the underside of the showerhead is not parallel to the top surface of the carrier structure and b) may be used to determine how much adjustment needs to be made to the showerhead in order to make the underside of the showerhead parallel to the top surface of the carrier structure.

For example, if the locations where the first components are located on the carrier structure are located so as to each be beneath a corresponding showerhead adjustment point, e.g., below a threaded coupler that can be rotated to move the portion of the showerhead connected thereto up or down, then each such adjustment point may be adjusted so as to move that portion of the showerhead up or down so that the distances D are all equalized.

Moreover, the absolute position of the showerhead within the chamber may also be determined in a somewhat similar manner. For example, the position of the top surface of the carrier structure relative to a coordinate system that is fixed with respect to the processing chamber may be a known quantity, e.g., the position of the top surface of the carrier structure relative to the coordinate system may be known for a particular height setting of the wafer support, and subsequent positions of the top surface of the carrier structure may be determined by compensating for any vertical displacement of the wafer support relative to that initial height setting. The wafer support may then be moved between two positions—first position in which none of the first components is in contact with the surface 132, and a second position in which a desired number of the first components (typically, all of the first components) have contacted the surface 132 and have been displaced downward relative to the carrier structure by some amount. The vertical position of the showerhead, e.g., the surface 132, relative to the chamber coordinate system may then be determined by subtracting the quantity (A' minus A) from B and then adding the result to the vertical position of the top surface of the carrier structure in the second position.

It will, of course, be understood that similar determinations may be made for any particular selected reference surfaces of a given carrier structure and/or wafer support; the above examples are simply provided by way of explanation and are not intended to be limiting.

In addition to the functionality discussed above, the apparatus may also have particular geometries that may allow for a limited range of free movement of the first component relative to the carrier structure while simultaneously constraining such movement such that the first component and the second component are prevented from potentially falling out of the carrier structure during normal use.

Figure 6:
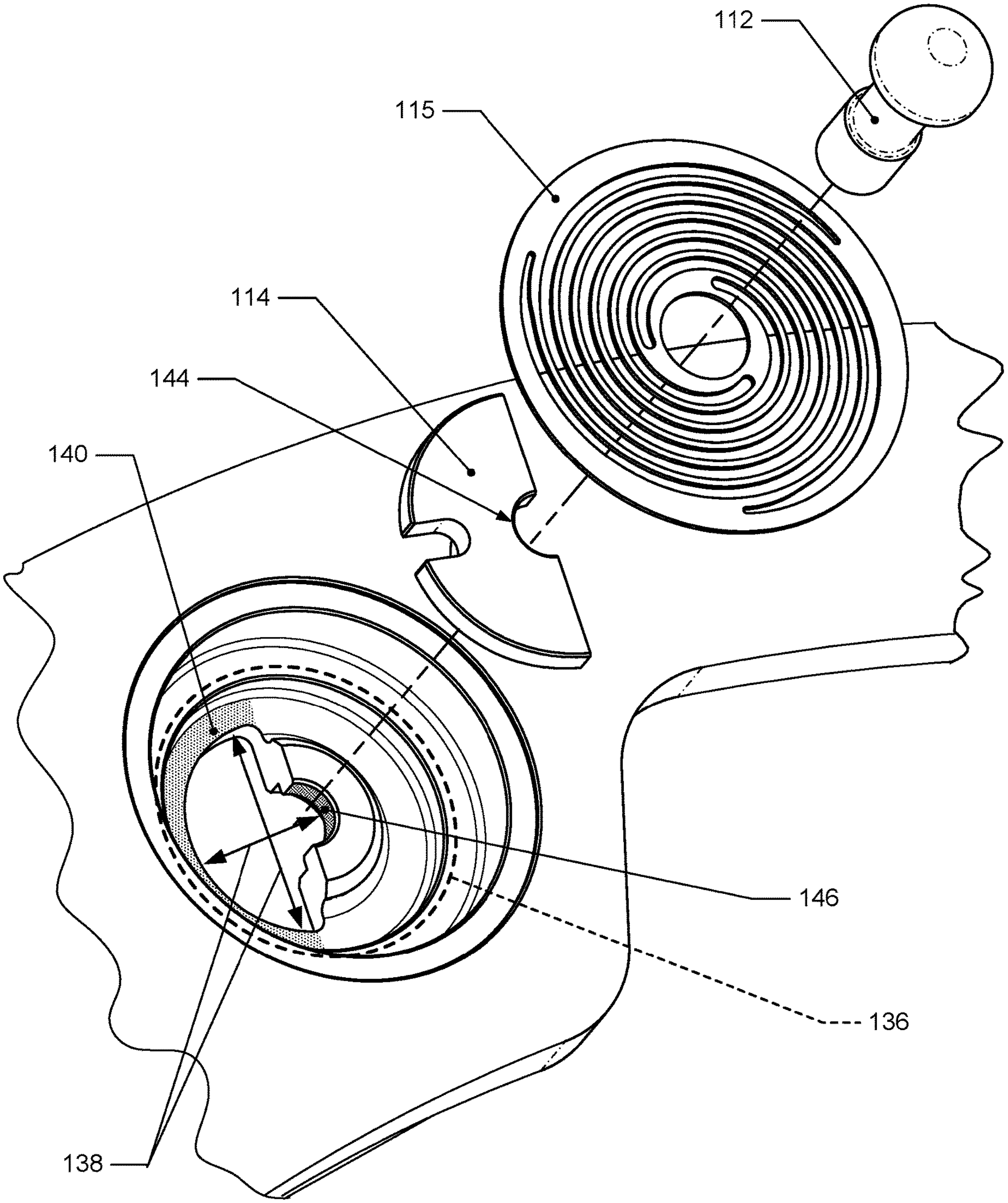
FIG. 6 depicts an off-angle exploded view of the location of FIG. 3.

For example, in some implementations, the carrier structure 102 may have an interface feature at each location. Referring back to FIG. 3, the interface feature includes various surfaces and is identified with identifier 136. The interface feature 136 is also shown in FIG. 6 which depicts an off-angle exploded view of the location of FIG. 3; the interface feature 136 in FIG. 6 is encircled by a dashed ellipse. In these Figures, the interface feature 136 has an opening identified with double arrow 138 (FIG. 6 includes two double arrows). The wall portion 122 of the second component 114 is sized and positioned so as to protrude through the opening 138 of the interface feature 136 and such that the flange portion 124 of the second component 114 is in contact with a first surface 140 (highlighted with shading in FIG. 6) of the interface feature 136. Additionally, an aperture 142, identified by another double arrow, may be formed, at least in part, by a surface 144, e.g., a semi-cylindrical surface, of the second component 114 and a second surface 146, e.g., a similar semi-cylindrical surface (highlighted in FIG. 6 with dark shading), of the carrier structure 102. The shaft 118 of the first component 112 may pass through this aperture 142 as seen in FIG. 3. In some implementations, as described herein, the support provided by the compliant member 115 may also result in the shaft 118 protruding from the carrier structure 102 to a greater extent than the wall portion 122 of the second component 114 at that location when the flange portion 124 is in contact with the first surface 140 of the interface feature 136 at that location.

For further illustration, FIG. 5B depicts some of these aspects more clearly. For instance, the interface feature 136 and the opening 138 are seen with the wall portion 122 of the second component 114 being sized and positioned so as to protrude through the opening 138. Also, the flange portion 124 of the second component 114 is further illustrated in contact with the first surface 140 of the interface feature 136. The aperture 142 is also seen formed, at least in part, by the surface 144 of the second component 114 and the second surface 146 of the carrier structure 102. The shaft 118 of the first component 112 passes through this aperture 142.

As mentioned above, the first component 114 may be a pin with the head 120 and the shaft 118. In some implementations, the head may have a larger cross-sectional area in a first plane perpendicular to the center axis of that pin than a cross-sectional area of the shaft of that pin in a second plane perpendicular to the center axis of that pin. Referring to FIG. 5A, which is viewed along an axis perpendicular to axis 116, which may be considered the center axis of the first component 112 and/or the axis of movement for the first component 112, the head 120 has a larger cross-sectional area, represented by double arrow 148, than the cross-sectional area, represented by double arrow 150, of the shaft 118.

In some implementations, the opening of each interface feature and the wall portion of the second component may be shaped and sized such that when the flange portion of that second component is in contact with the first surface of that interface feature, the second component is substantially prevented from moving laterally relative to the carrier structure, e.g., by no more than ±1 mm or ±2 mm. For example, as illustrated in FIGS. 3 and 5B, the opening 138 of the interface feature 136 and the wall portion 122 of the second component 114 are shaped and sized such that when the flange portion 124 of the second component 114 is in contact with the first surface 140 of the interface feature 136, the second component 114 is substantially prevented from moving laterally relative to the carrier structure 102, e.g., in one or more directions perpendicular to the axis 116. For example, the opening 138 and the wall portion 122 may both have a semicircular shape, with the wall portion 122 having an outer semicircular surface that is generally the same radius as a semicircular surface defining part of the opening 138. A third surface 151 of the interface feature 136 may prevent lateral movement of the second component 114.

Figure 7A:
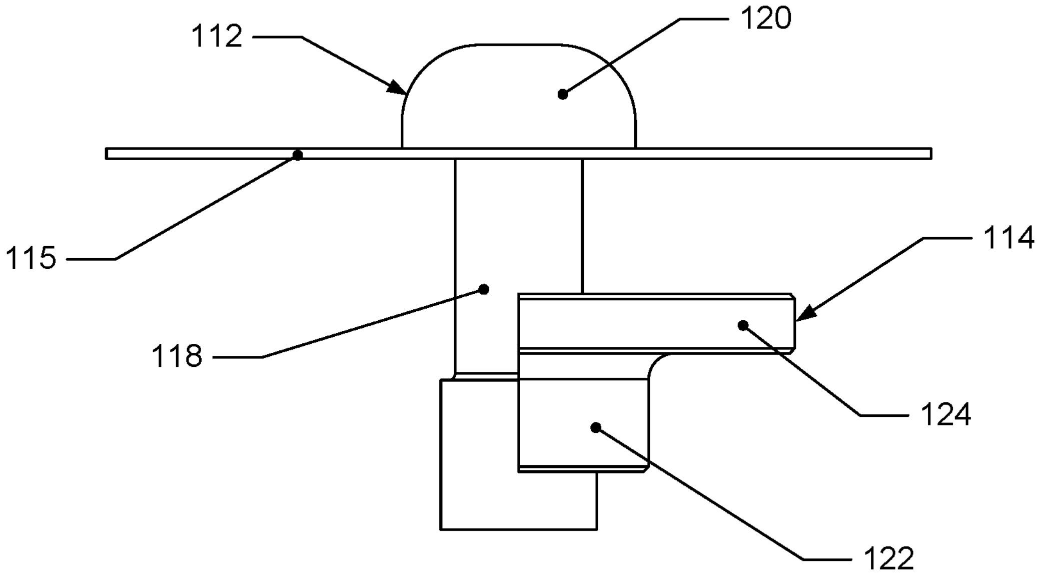
FIG. 7A depicts a side view of a first component, a compliant member, and a second component.
Figure 7B:
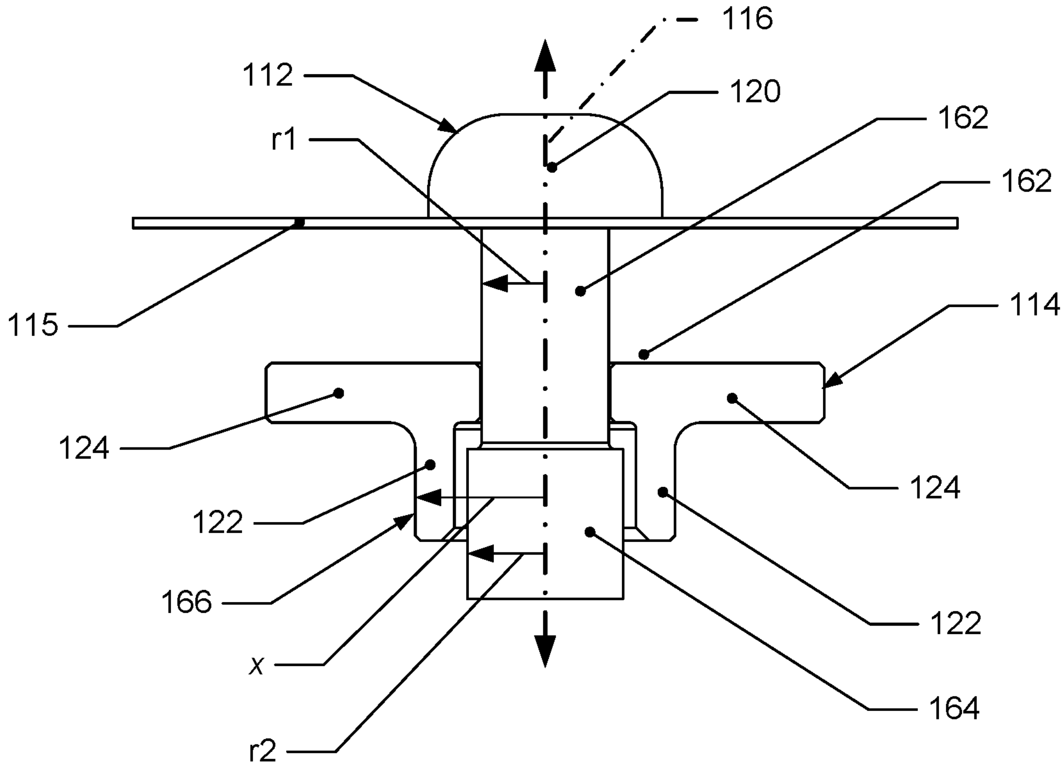
FIG. 7B depicts a front view of the first component, the compliant member, and the second component of FIG. 7A.

Additional features of the compliant member, first component, and second component will now be discussed and illustrated using FIGS. 7A through 7E which depict different views of these elements. FIG. 7A depicts a side view of a first component, a compliant member, and a second component and FIG. 7B depicts a front view of the first component, the compliant member, and the second component of FIG. 7A. The first component 112, the second member 114, and compliant member 115 are identified and no cross-sectional views or cuts have been taken in FIGS. 7A-7E. The head 120 and shaft 118 of the first component 112 are also labeled, along with the wall portion 122 and the flange portion 124 of the second component 114.

In some instances, the shaft of the first component and the second component may be configured to allow the first component to move along the axis relative to the second component. In some such implementations, referring to FIG. 7B for illustration, the shaft 118 of the first component may have a first shaft portion 162 having a first radius $r_1$ and a second shaft portion 164 having a second radius $r_2$. The wall portion 122 of the second component 114 may have an outermost surface 166 that is offset from a surface of the opening facing the wall portion at that location by a distance x in a direction that radiates outward from the center point 162 (or 116) of the annulus sector-shaped cross-section of that wall portion. Further, in some such instances, $r_2$ is greater than $r_1$ and x is greater than $$\sqrt{r_2^2 - r_1^2}.$$

This configuration may enable the wall portion to be shifted radially outward once the second component is moved along the axis 116 such that the flange portion 124 is spaced apart from the facing surface of the carrier structure 102, thereby allowing the shaft to be moved radially outward by a smaller amount to clear and move along the axis 116 relative to the wall portion.

The compliant member may be configured in various manners to support the first component and move in response to forces exerted onto the first component. The compliant member may be a spring or flexure structure that is configured to elastically deform and return to its original position at high temperatures, including above 200° C., 300° C., 400° C., 500° C., or 600° C., for example. In some embodiments, the compliant member may be made of, for example, a nickel alloy such as Haynes® 242® or Haynes® 230° high-temperature alloy, or an aluminum-alumina matrix composite.

Figure 7C:
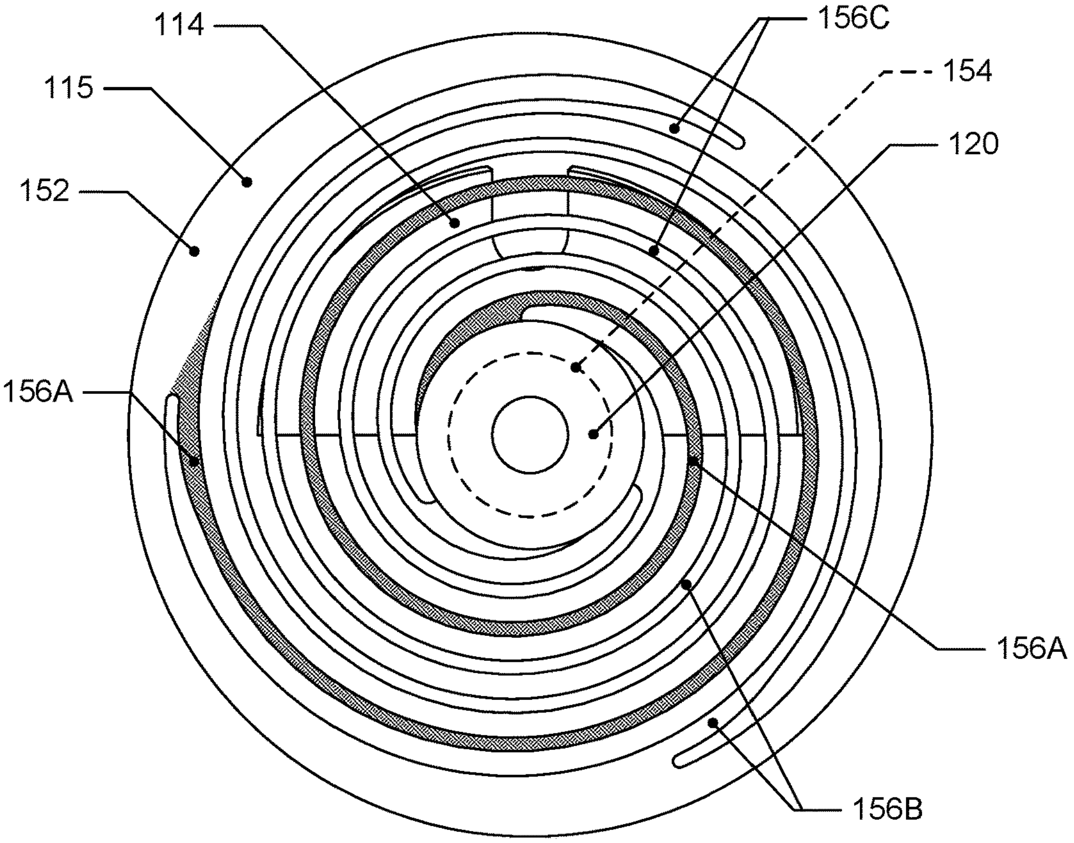
FIG. 7C depicts a top view of the first component, compliant member, and second component of FIG. 7A.

In some implementations, the compliant member may have an outer ring, an inner ring, and one or more flexure elements that extend between the outer and inner rings. In some such instances, the compliant member may have a circular array of multiple flexure elements that each extend from the outer ring to the inner ring along a spiral path. In FIG. 7C, which depicts a top view of the first component, the compliant member, and the second component of FIG. 7A, the head 120 of the first component 112 is visible and the compliant member 115 includes an outer ring 152 and an inner ring 154 which is covered by the head 120 but represented with a dashed line; the inner ring is visible in FIG. 7D. The compliant member 115 includes three flexure elements 156A through 156C that each follow a spiral path between the outer ring 152 and the inner ring 154, with flexure element 156A illustrated with shading.

Figure 7D:
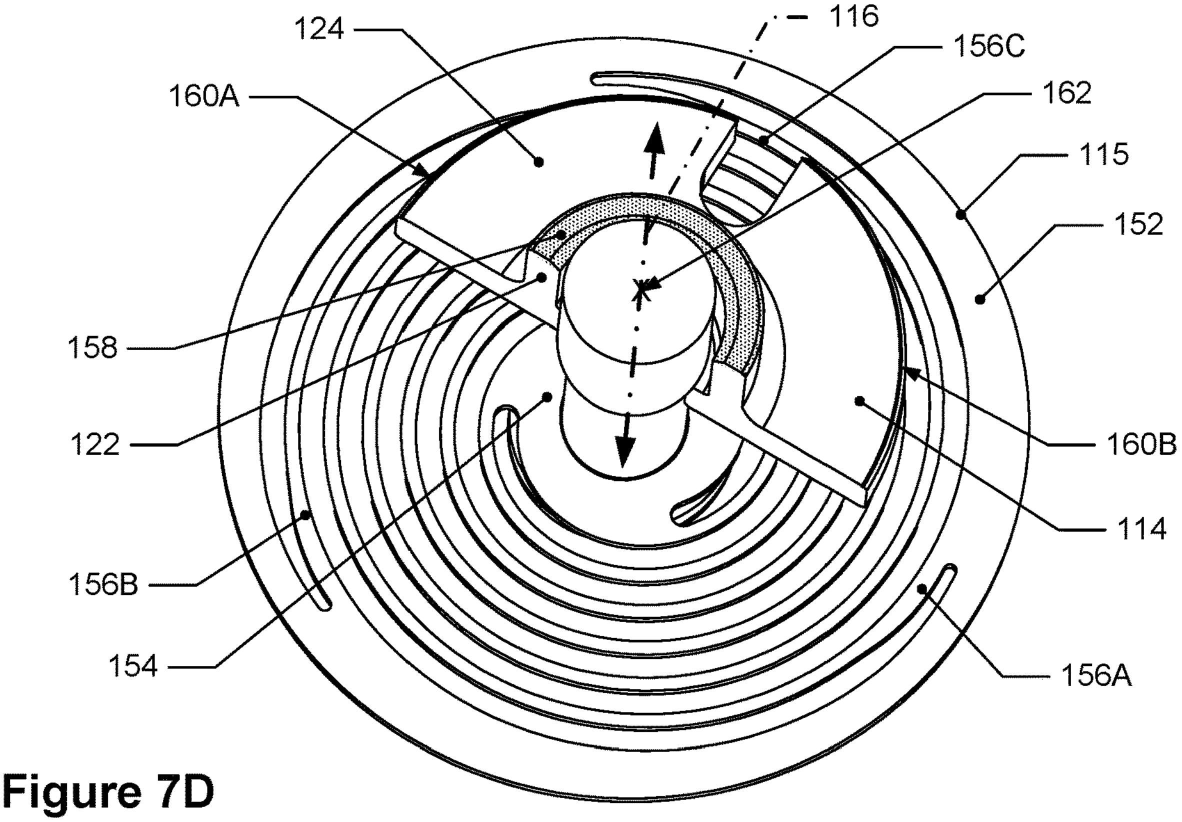
FIG. 7D depicts an off-angle view of the first component, the compliant member, and the second component of FIG. 7A.
Figure 7E:
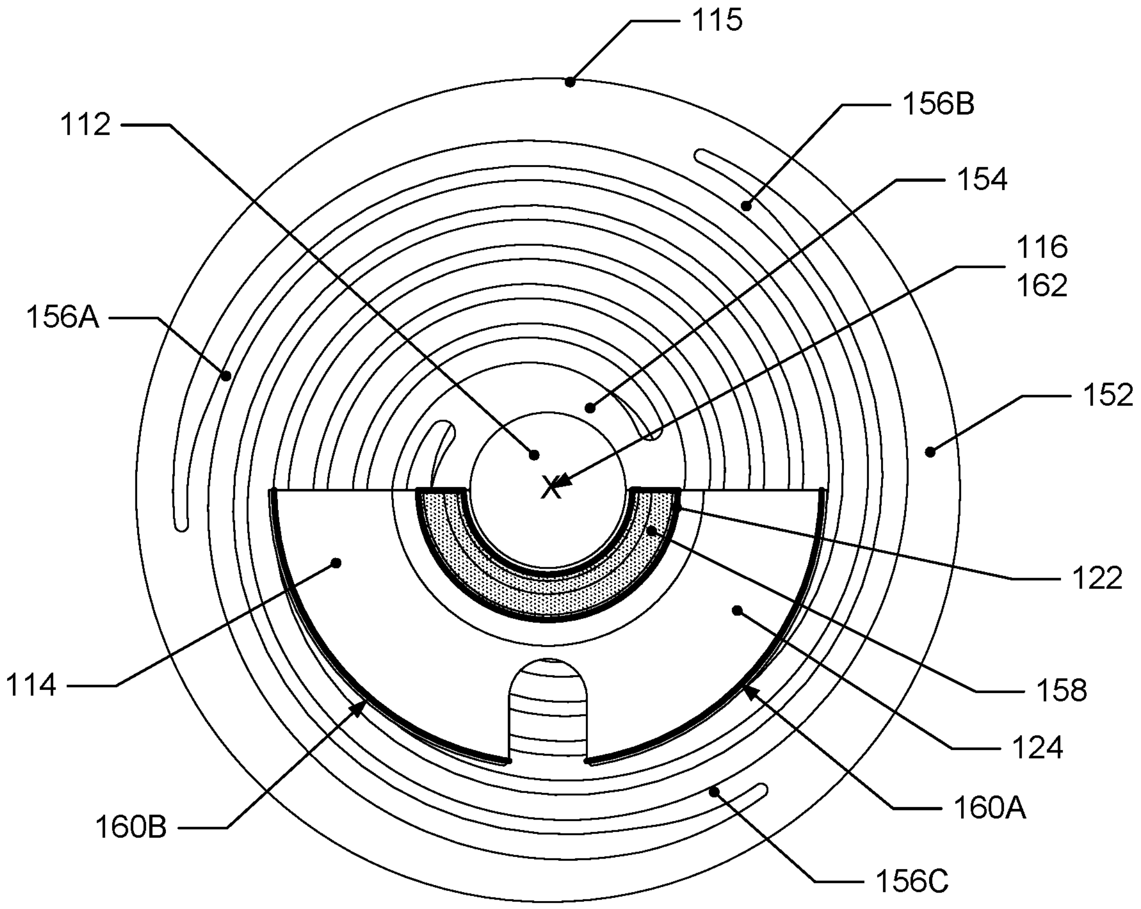
FIG. 7E depicts a bottom view of the first component, the compliant member, and the second component of FIG. 7A.

FIG. 7D depicts an off-angle view of the first component, the compliant member, and the second component of FIG. 7A. Here, the undersides of these components are seen, with the compliant member 115 and its three flexure elements 156A-156B spanning between the outer ring 152 and the inner ring 154. The wall portion 122 and the flange portion 124 of the second component 114 are also illustrated. In some embodiments, as shown in FIGS. 7D and 7E discussed below, the wall portion 122 may have an annulus sector-shaped cross-section 158 in a plane perpendicular to the center axis 116 of the first component 112. The flange portion 124 of the second component 114 may also have one or more arcuate outermost surfaces, two of which are labeled 160A and 160B, that each have a center point, the “X” labeled 162, that are concentric with the center point 162 of the annulus sector-shaped cross-section 158 of the wall portion 122. As also seen, the axis 116 also extends through the center point 162.

FIG. 7E depicts a bottom view of the first component, the compliant member, and the second component of FIG. 7A. The annulus sector-shaped cross-section 158 of the wall portion 122 in the plane perpendicular to the center axis 116 of the first component 112 is further illustrated; the outline of this cross-section 158 and the wall portion 122 are depicted with bold lines. The two arcuate outermost surfaces 160A and 160B of the flange portion 124 of the second component 114 are also shown with the center point 162 concentric with the center point 162 of the annulus sector-shaped cross-section 158 of the wall portion 122, and with the axis 116.

Figure 8:
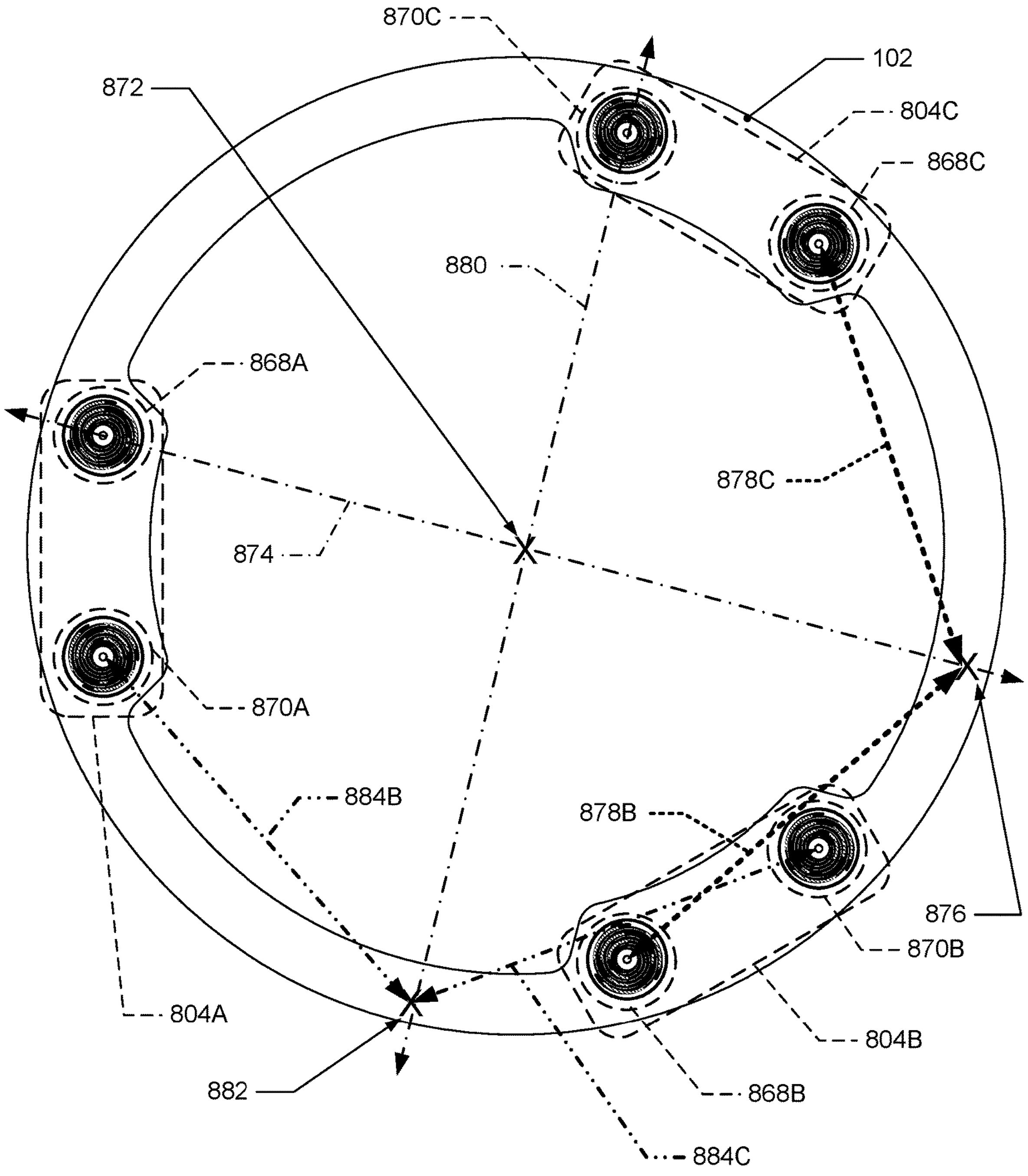
FIG. 8 depicts a top view of the carrier structure of FIG. 1.

Additional features of the carrier structure will now be discussed. Referring back to FIG. 1, in some embodiments, the carrier structure may be a ring-like shape and FIG. 8 depicts a top view of the carrier structure of FIG. 1. The carrier structure may include at least three locations and FIG. 8 depicts three locations 804A, 804B, and 804C located within the dashed rectangles. Each of these locations are seen spaced apart from one another about the carrier structure 102. In some instances, these locations are equally, or substantially equally, spaced about the carrier structure 102 such as spaced about 120° or approximately 120° apart, e.g., 120°+10°, from each other about the carrier structure 102.

In some implementations, the carrier structure may have multiple sets of locations. For example, the locations of the carrier structure may have a first set of locations and a second set of locations that are spaced apart from each other along the carrier structure. As illustrated in FIG. 8, the three locations 804A-C include a first set of locations 868A-C and a second set of locations 870A-C, respectively. Location 804A includes one of the first set of locations 868A and one of the second set of locations 870A; locations 804B and 804C are similarly arranged. Each of the first set of locations 868A-C and the second set of locations 870A-C includes a first component, second component, and compliant member as described above. In some embodiments, the first set of locations 868A-C are equally spaced, or substantially spaced, about the carrier structure 102 from each other, such as spaced about 120° about the carrier structure 102; the second set of locations 870A-C are equally spaced, or substantially spaced, about the carrier structure 102 from each other, such as spaced about 120° about the carrier structure 102.

In some embodiments, the locations of the first set of three locations 870A-C and the second set of three locations 868A-C are arranged about a common center point 872 of the carrier structure 802. The locations in the first set of three locations 868A-C may be arranged such that a first reference axis 874 that extends through a location 868A in the first set of three locations 868A-C and through the common center point 872 intersects with a first reference point 876 and distances 878B and 878C between the first reference point 876 and each of the other two locations 868B and 868C, respectively, in the first set of three locations 868 A-C are equal or substantially equal. Similarly, the locations in the second set of three locations 870A-C are arranged such that a second reference axis 880, perpendicular to the first reference axis 872, that extends through a location in the second set of three locations 870A-C and through the common center point 872 intersects with a second reference point 882 and distances 884B and 884C between the second reference point 882 and each of the other two locations 870A and 870B in the second set of three locations 870A-C are equal or substantially equal.

An apparatus as provided above enables a camera system to be moved about between different viewports that may peer into a multi-station processing chamber, e.g., a quad-station processing chamber, so as to be able to obtain image information of the apparatus when positioned at different stations within the chamber, thereby allowing the alignment and/or vertical positioning of the showerheads at those stations to be determined as discussed earlier. Different sets of locations may be imaged depending on through which viewport the imaging system is imaging through and which station the apparatus is positioned at. For example, an imaging system with a plurality of imaging sensors may be positioned at a single location outside a processing chamber and the apparatus described herein used to provide viewable surfaces that can be concurrently detected by the imaging sensors of the imaging system. The apparatus may be placed within the chamber such that locations with the first and second components are concurrently viewable by the imaging system.

Figure 9:
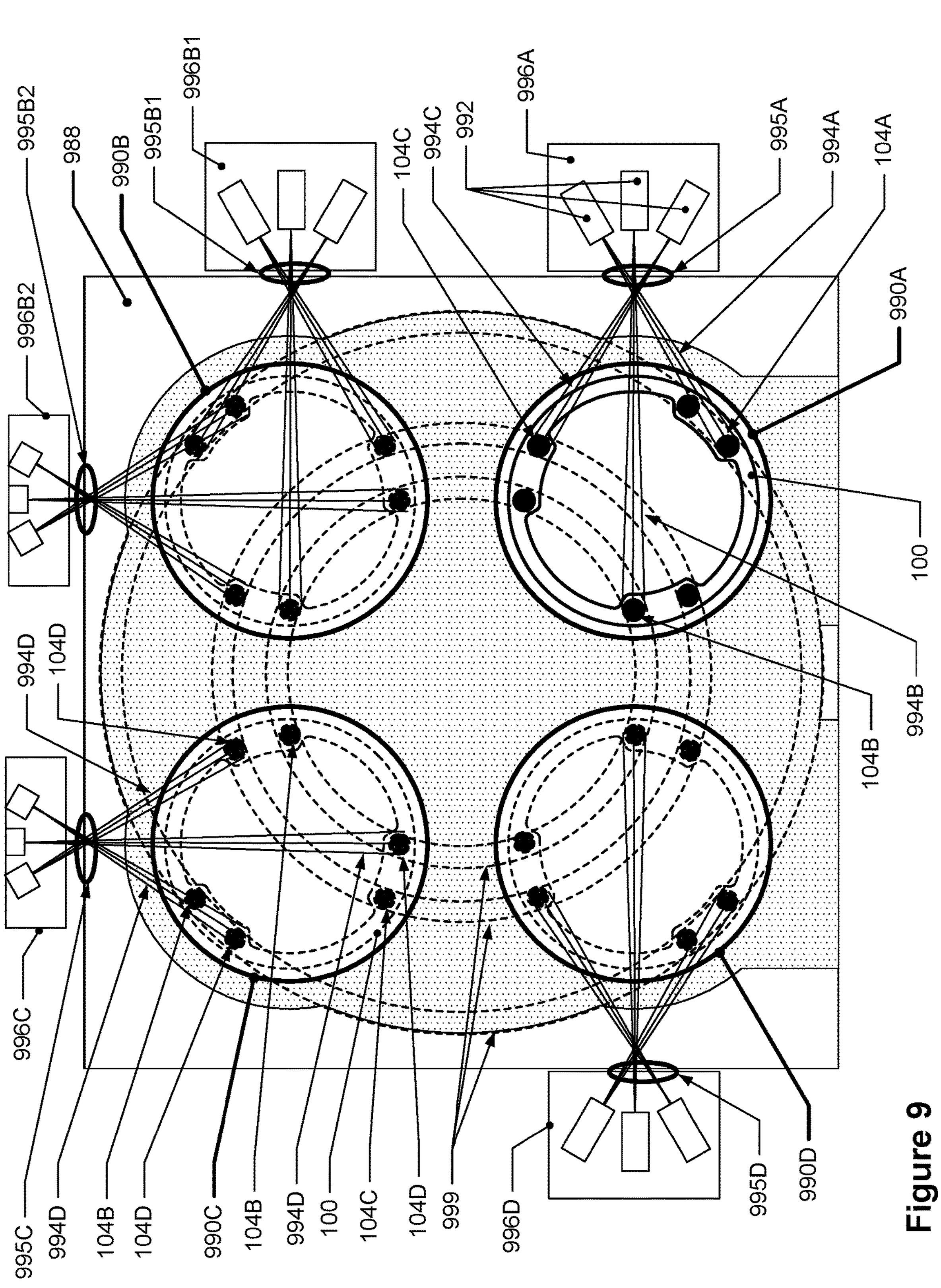
FIG. 9 depicts a processing chamber having four processing stations.

FIG. 9 depicts a processing chamber having four processing stations. In this example, the chamber 988 includes processing stations 190A-D (within the dashed circles) with station 190A including an apparatus 100 as described herein. In some implementations, the chamber 988 may have a wafer transfer unit, such as a carousel or indexer, that may rotate and thereby transfer a wafer (or the apparatus) from station to station. In some such embodiments, a single apparatus 100 may be used by positioning it on one of the substrate supports at one station 190A and then transferred between each station 990A-D without removing it from that substrate support. In these implementations, the apparatus 100 provides visible surfaces capable of detection by the one or more imaging sensors, such as the three imaging sensors 992, positioned outside the chamber 988 at location 996A. This configuration may include positioning the carrier structure's locations and corresponding components so that a line of sight is provided to at least three locations on the apparatus to each of the three imaging sensors at each of the stations. For example, as seen with station 990A, each imaging sensor has a line of sight 994A-C to locations 104A-C, respectively, on apparatus 100.

If the apparatus 102A is moved to another station, such as to station 990C by rotating the carousel or indexer, then apparatus 100 may be positioned at station 990C at a different orientation with respect to the chamber than at station 990A. Stations 190B-D include dashed apparatuses indicating the potential positioning of the apparatus 100 when it may be moved to each of these stations. Despite the different orientation at station 990C, the relocated apparatus 100 provides lines of sight 994D-F to imaging sensors located at position 996C. In the depicted example, these lines of sight are to different locations on the apparatus 100 than those used at station 990A. For instance, lines of sight 994D-F are directed to locations 104D-F, respectively, on apparatus 100 which are different than locations 104A-C also labeled at station 990C. The concentric dashed rings 999 illustrate the paths that the locations on the apparatus may take as the apparatus is transferred between stations 990A-D on the carousel or indexer. As can be seen, when imaging sensors are positioned at any of locations 996A-D, the imaging sensors have lines of sight to at least three locations on the apparatus at the corresponding station. The chamber 988 may include viewports 995A-D that allow the imaging sensors to view the chamber interior. The chamber may also have multiple viewports for a single station, such as station 990B which includes viewports 995B1 and 995B2 that enable imaging sensors at locations 996B1 and 996B2 to have lines of sight to the station 990B.

Additional Apparatuses

While the above discussion is directed at an apparatus for use in backside deposition (or etch) processing systems, other apparatuses may be used for frontside deposition or etch processing systems.

For example, in another embodiment, the apparatus may have a carrier structure and a plurality of locations that each have a first component that has a reference surface and a contact surface, and that is connected to the carrier structure with two flexure structures pivotally connected to the first component and the carrier structure. The apparatus is configured to allow the first component to be raised up from a first position to a second position above the carrier structure. The contact surface may be contacted by the showerhead above the apparatus to cause the first component to move downwards relative to the carrier structure and bend or flex the flexure structures. Similar to above, the relative displacement of this first component may be measured with respect to a known surface below the first component on the apparatus. This known surface may be on the carrier structure or may be on a second component that also includes two flexure structures pivotally connected to this second component and the carrier structure, and configured to be raised into an elevated, stationary—but known—position above the carrier structure but below the first component.

Figure 10A:
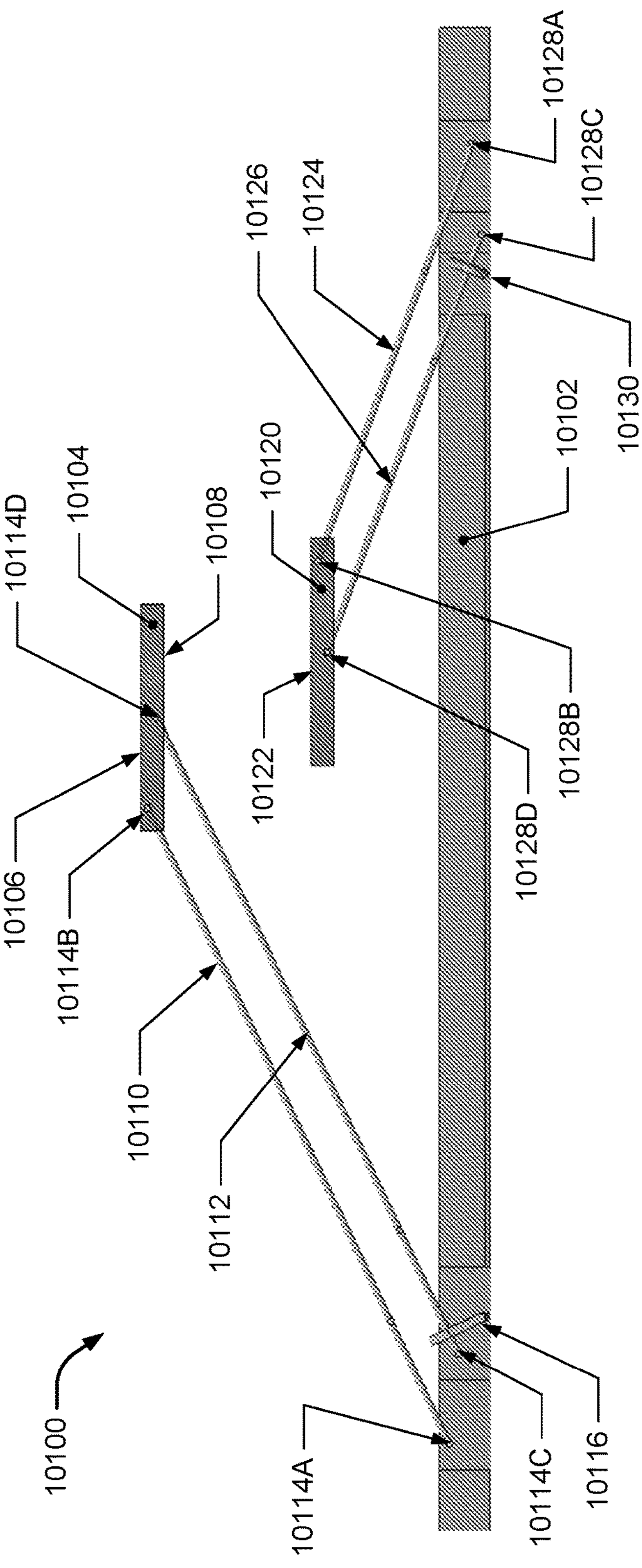
FIG. 10A depicts a side view of one location of another example apparatus.

FIG. 10A depicts a side view of one location of another example apparatus. This apparatus 10100 includes a carrier structure 10102 and at least three locations (only one of which is shown), with each location having a first component 10104 with a contact surface 10106 and a reference surface 10108 that is parallel to the contact surface 10106, a first flexure structure 10110, and a second flexure structure 10112. The first component 10104 is connected to the carrier structure 10102 by the first flexure structure 10110 and the second flexure structure 10112 which are pivotally connected to both the carrier structure 10102 and the first component 10104. The first flexure structure 10110 is connected at pivot 10114A to the carrier structure 10102 and at pivot 10114B to the first component 10104, and the second flexure structure 10112 is connected at pivot 10114C to the carrier structure 10102 and at pivot 10114D to the first component 10104. This configuration of pivots and flexure structures provides, in effect, a four-bar linkage that constrains the movement of the first component 10104 such that the contact surface 10106 does not experience a substantial change in angular orientation (e.g., about pivots 10114B or 10114D, for example) during movement of the first component 10104 from a first position relative to the carrier structure to a second position relative to the carrier structure. In FIG. 10A, the first component 10104 is shown in the second position.

The apparatus may also include a trigger structure that is configured to cause the first component to move to the second position when the apparatus is placed on a substrate support. The trigger structure may be connected to at least one of the flexure structures and protrude below a bottom surface of the carrier structure. When the carrier structure is placed on the substrate support, the trigger structure contacts the substrate support and is pushed upwards by the substrate support in response to downward force from the weight of the carrier structure, which in turn causes the flexure structure and first component to move from the first position to the second position. During this movement, the flexure structures constrain the first component's movement such that the contact surface does not experience a substantial change in angular orientation. In FIG. 10A, the apparatus 10100 includes a trigger structure 10116 that is connected to the second flexure structure 10112.

Figure 10B:
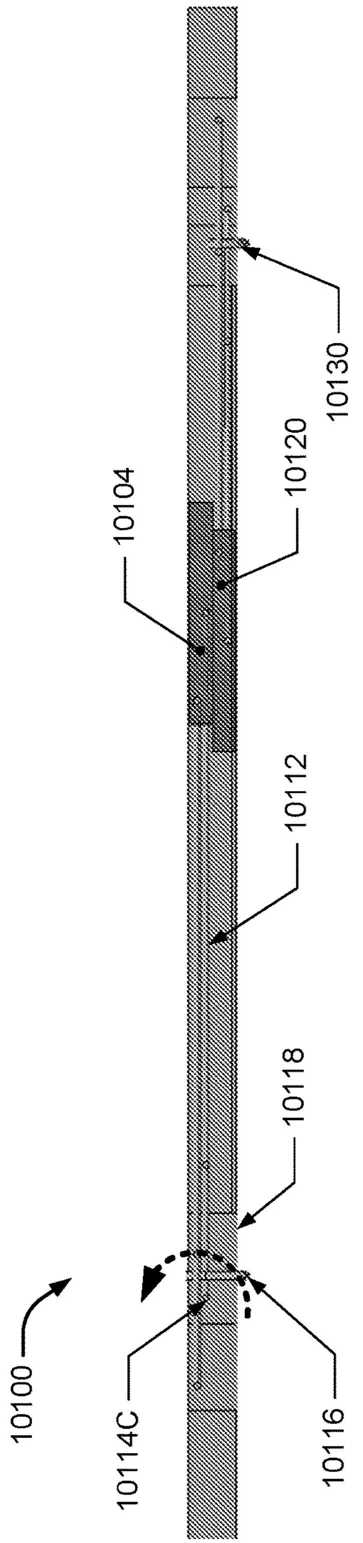
FIG. 10B depicts a side view of the apparatus of FIG. 10A in a different configuration.

In FIG. 10B, which depicts a side view of the apparatus of FIG. 10A in a different configuration, the first component 10104 is in the first position and the trigger structure 10116 is configured to protrude below the bottom surface 10118 of the carrier structure 10102 when the first component 10104 is in this first position. When the carrier structure 10102 is placed on a substrate support, the trigger structure 10116 is contacted by, and caused to move by, the substrate support when the carrier structure comes to rest on the substrate support; this causes the second flexure structure 10112 to move and rotate about the pivot 10114C (as indicated by the dotted arrow), and causes the first component 10104 to move from the first position (in FIG. 10B) to the second position (in FIG. 10A).

Figure 10C:
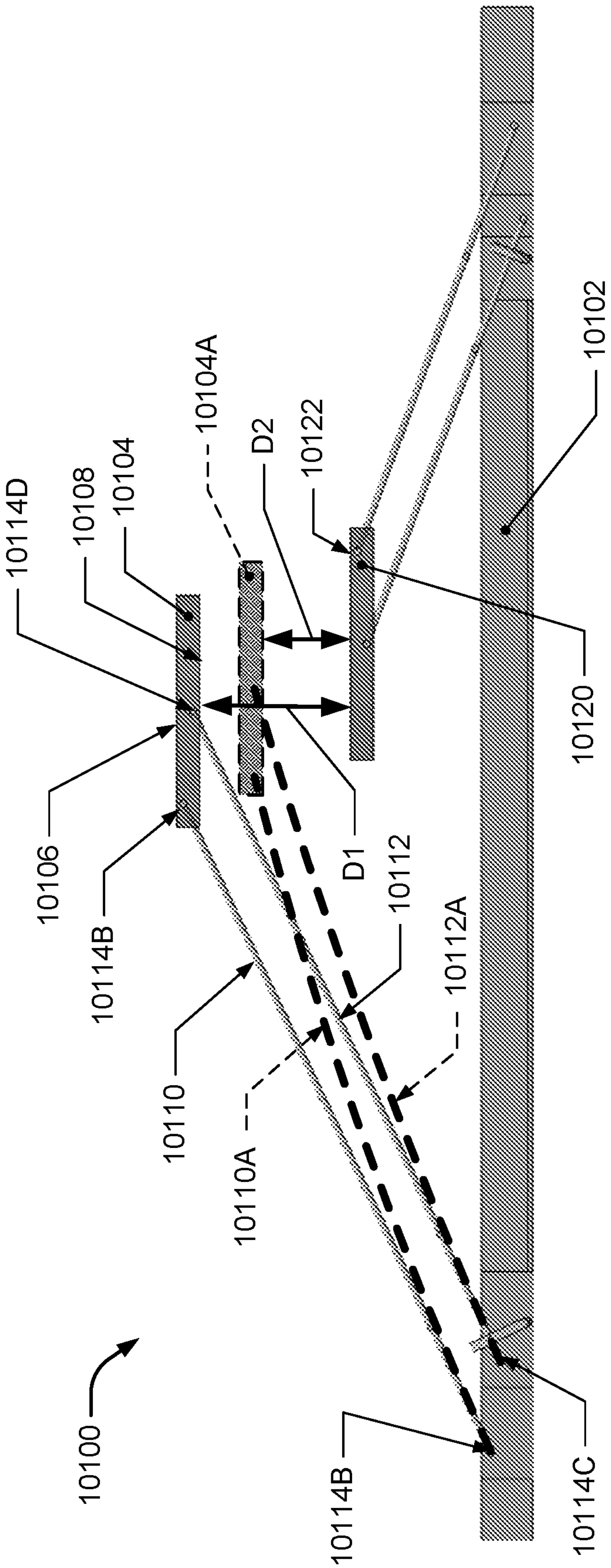
FIG. 10C depicts the apparatus of FIG. 10A during a movement sequence.

The apparatus 10100 may enable one or more detections and measurements of the distance between the showerhead and the pedestal in various manners. For example, the movement and displacement of first component relative to a known surface on the carrier structure may be detected by one or more imaging sensors, e.g., in an imaging system that looks into the chamber in which the apparatus 10100 is used through a viewport. FIG. 10C depicts the apparatus of FIG. 10A during a movement sequence. Here, the contact surface 10106 of the first component 10104 is configured to be contacted by the showerhead (or other surface above the substrate support) and moved relative to the carrier structure 10102. This movement may be caused by moving the showerhead, the substrate support, or both.

As the first component 10104 is caused to move relative to the carrier structure 10102, the first flexure structure 10110 and the second flexure structure 10112 are caused to flex and/or rotate about one or more of their respective pivots in order to allow the first component 10104 to move and also to constrain the first component 10104 so that the contact surface 10106 thereof does not experience a substantial change in angular orientation during this movement. The movement of these components is illustrated with dashed lines showing the flexed first flexure structure 10110A and the flexed second flexure structure 10112A, and the moved first component 10104A. Before, during, and/or after this movement of the first component 10104, the reference surface 10208 may be detected by the one or more imaging sensors in order to measure aspects of the gap.

In some embodiments, the first component may not be moved fully into the second position, but instead may be caused to be moved from the first positions into the lowered position shown in FIG. 3. For instance, the showerhead may be positioned close to the substrate support such that when the apparatus is positioned on the substrate support, the first component cannot raise up to the second position. Instead, the first component is raised up and contacted by the showerhead which constrains the first component's movement and causes the first component and its flexure structures to be positioned like items 10104A, 10112A, and 10114A in FIG. 3.

In some embodiments, the apparatus may include one or more second reference surfaces that are fixed in space with respect to the carrier structure and positioned such that when the first component is in the second configuration a separation gap is visible between the first reference surfaces and the one or more second reference surfaces when viewed along a direction parallel to the one or more second reference surfaces. In some embodiments, the one or more second reference surfaces may be on the carrier structure itself. In some embodiments, the one or more second reference surfaces may be provided on a second component that may also have flexure structures and a trigger structure similar to the first component.

Referring back to FIG. 10A, the apparatus 10100 includes a second component 10120 that has a second reference surface 10122 and that is connected to the carrier structure 10102 by a third flexure structure 10124 and a fourth flexure structure 10126 that are each pivotally to the second component 10120 and carrier structure 10102. The third flexure structure 10124 is connected to the second component 10120 at pivot 10128B and to the carrier structure 10102 at pivot 10128A; the fourth flexure structure 10126 is connected to the second component 10120 at pivot 10128D and to the carrier structure 10102 at pivot 10128C. Similar to above, the third flexure structure 10124 and the fourth flexure structure 10126 are configured to constrain movement of the second component 10120 such that the second reference surface 10122 thereof does not experience a substantial change in angular orientation during movement of the second component 10120 from a third position (as illustrated in FIG. 10B) relative to the carrier structure 10102 to a fourth position (as illustrated in FIG. 10A) relative to the carrier structure 10102.

Also similar to above, another trigger structure 10130 is connected to the fourth flexure structure 10126 and configured the same as trigger structure 10116. For example, when the carrier structure is placed on the substrate support, the trigger structure 10116 causes the second component 10120 to move to the fourth position (as shown in FIG. 10A), from the third position (as shown in FIG. 10B). Additionally, as seen in FIG. 10A, the second component 10120 may be closer to the carrier structure 10102 than the contact surface 10106 of the first component 10104 when the first component 10104 is in the second position and the second component 10120 is in the fourth position.

Referring back to FIG. 10C, once the first component 10104 has been caused to move relative to the known reference surface, which may be on carrier structure 10102 or on the second component 10120, the relative displacement of the reference surface 10108 on the first component 10104 with respect to this known surface may be detected and measured by the one or more imaging sensors. This may enable measurement of the distance D1 between the reference surface 10108 of the first component 10102 and the second reference surface 10122 of the second component 10120 while the first component 10102 is in the first position, and measurement of other distances, such as D2, when the first component 10102 has been moved relative to the carrier structure 10102.

As with apparatus 100, the carrier structure 10102 of the apparatus 10100 is sized to be placed within a semiconductor processing chamber such that at least three locations on the carrier structure are interposed between a pedestal of the semiconductor processing chamber and a showerhead disposed above the pedestal. Further, the elements of the apparatus 10100 are configured to withstand and operate at the high temperatures provided above, such as over 200° C., 300° C., 400° C., 500° C., or 600° C., for example.

Results

Figure 11B:
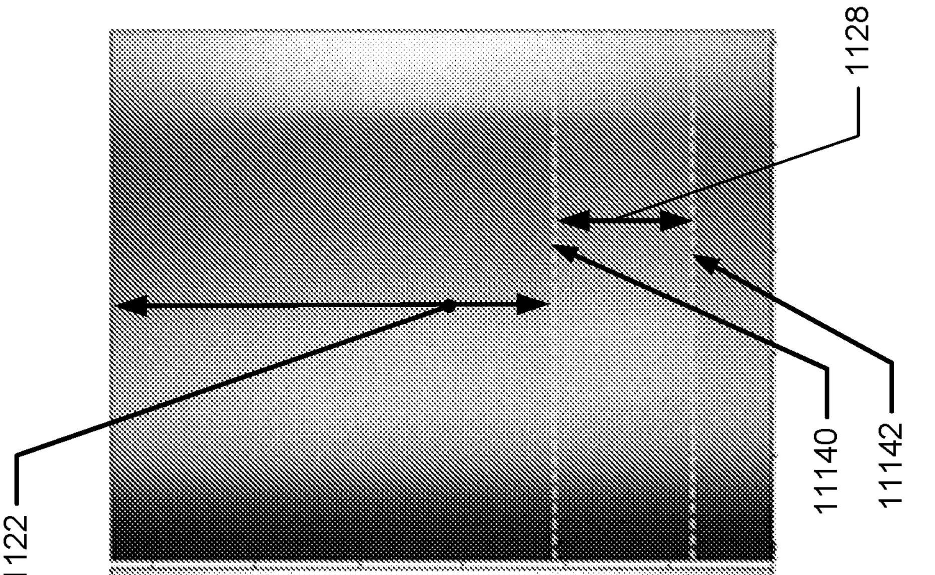
FIG. 11B depicts an annotated version of FIG. 11A.
Figure 11A:
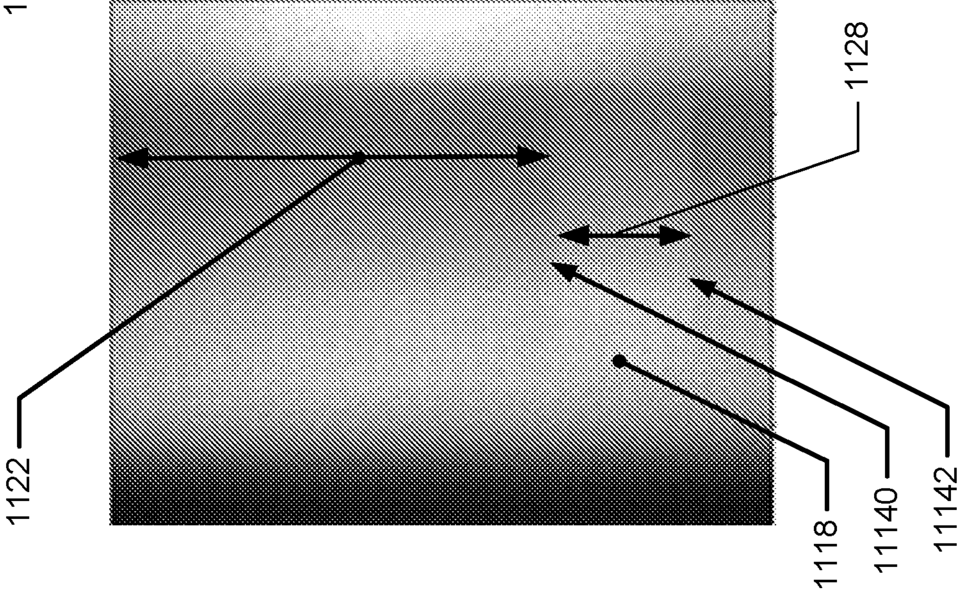
FIG. 11A depicts an image of a side view of a first component and a second component.

FIGS. 11A and 11B depicts two images and one data plot of a first component and a second component. FIG. 11A depicts an image of a side view of portions of a first component and a second component. In FIG. 11A, the lighter shaded area is the shaft 1118 of the first component and the viewable section 1128 of the first component, and the darker shading above this section 1128 is the viewable section of the second component, labeled as the wall portion 1122. FIG. 11B depicts successful, computer vision edge detection of the materials of interest in FIG. 11A with a top dotted line 11140 that indicates the bottom edge of the second component (also labeled in FIG. 4A) and a bottom dotted line 1142 that indicates the bottom edge of the first component (also labeled in FIG. 4A). As is likely apparent, the transition between the first and second components (or the end of the first component) are relatively difficult to discern due to the low level of illumination provided by the plasma within the chamber; the use of high-optical-contrast materials for the first and second components allows for such transitions to still be detectable even in the dim lighting conditions.

It is to be understood that the use of ordinal indicators, e.g., (a), (b), (c), . . . , herein is for organizational purposes only, and is not intended to convey any particular sequence or importance to the items associated with each ordinal indicator. For example, “(a) obtain information regarding velocity and (b) obtain information regarding position” would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., “(a) obtain information regarding velocity, (b) determine a first acceleration based on the information regarding velocity, and (c) obtain information regarding position”; in this example, (a) would need to be performed (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The term “substantially” herein, unless otherwise specified, means within 5% of the referenced value. For example, substantially perpendicular means within +/−5% of parallel. The term “substantially” may be used herein to indicate that while exactness of measurements and relationships may be intended, exactness is not always achieved or achievable because of manufacturing imperfections and tolerances. For instance, it may be intended to manufacture two separate features to have the same size (e.g., two holes), but because of various manufacturing imperfections, these features may be close to, but not exactly, the same size.

What is claimed is:

1. An apparatus comprising:

a carrier structure sized to be placed within a semiconductor processing chamber such that at least three locations on the carrier structure are interposed between a pedestal of the semiconductor processing chamber and a showerhead disposed above the pedestal, wherein:

each of the at least three locations has a corresponding first component and a corresponding second component, the first component at each location is movable at least along a first axis relative to the second component at that location and relative to the carrier structure, the first component at each location is supported relative to the carrier structure in at least one direction by at least one corresponding compliant member that is configured to apply a biasing force to that first component that urges that first component into a corresponding first position relative to the carrier structure, an outer surface of the first component has first optical properties and an outer surface of the second component has second optical properties, the first optical properties and the second optical properties have high optical contrast with respect to one another, and the first component and the second component at each location are arranged such that when the first component is moved relative to the carrier structure along the first axis, an amount of the first component obscured by the second component when viewed along an axis perpendicular to the first axis changes, wherein:

the carrier structure has a corresponding interface feature at each location, each interface feature has a corresponding opening, each first component is a pin having a head and a shaft arranged along a center axis, the head of each pin has a larger cross-sectional area in a first plane perpendicular to the center axis of that pin than a cross-sectional area of the shaft of that pin in a second plane perpendicular to the center axis of that pin, each second component has a corresponding wall portion and a corresponding flange portion, the wall portion of each second component is sized and positioned so as to protrude through the opening of the interface feature at the location having that second component and such that the flange portion of that second component is in contact with a first surface of that interface feature, and the shaft of the pin at each location passes through an aperture formed, at least in part, by a surface of the second component at that location and a second surface of the carrier structure at that location.

2. The apparatus of claim 1, wherein the at least one compliant member at each location is a spring that supports the pin at that location at least when the apparatus is oriented such that the head of that pin is directly above the shaft of that pin.

3. The apparatus of claim 2, wherein the spring at each location supports the pin at that location at least when the apparatus is oriented such that the head of that pin is directly above the shaft of that pin and such that the shaft of that pin protrudes from the carrier structure to a greater extent than the wall portion of the second component at that location when the flange portion of that second component is in contact with the first surface of the interface feature at that location.

4. The apparatus of claim 2, wherein each spring has an outer ring, an inner ring, and a circular array of multiple flexure elements that each extend from the outer ring to the inner ring along a spiral path.

5. The apparatus of claim 1, wherein the opening of each interface feature and the wall portion of the second component that protrudes therethrough are shaped and sized such that when the flange portion of that second component is in contact with the first surface of that interface feature, the second component is substantially prevented from moving laterally relative to the carrier structure.

6. The apparatus of claim 5, wherein:

the wall portion of each second component has an annulus sector-shaped cross-section in a plane perpendicular to the center axis of the pin, and the flange portion of each second component has one or more arcuate outermost surfaces that each have a center point that is concentric with a center point of the annulus sector-shaped cross-section of the wall portion of that second component.

7. The apparatus of claim 6, wherein, for each location:

the shaft of the pin for that location has a first shaft portion having a first radius $r_1$ and a second shaft portion having a second radius $r_2$, the wall portion of the second component for that location has an outermost surface that is offset from a surface of the opening facing the wall portion at that location by a distance x in a direction that radiates outward from the center point of the annulus sector-shaped cross-section of that wall portion, and $$r_2 > r_1 \text{ and } x > \sqrt{r_2^2 - r_1^2}.$$

8. The apparatus of claim 1, wherein:

the carrier structure has a ring-like shape, the at least three locations include a first set of three locations, and the locations in the first set of three locations are spaced apart from one another about the carrier structure.

9. The apparatus of claim 8, wherein:

the at least three locations further include a second set of three locations, and the locations in the second set of three locations are spaced apart from one another about the carrier structure and apart from the locations in the first set of three locations.

10. The apparatus of claim 9, wherein:

the locations in the first set of three locations and the second set of three locations are arranged about a common center point, the locations in the first set of three locations are arranged such that a) a first reference axis that extends through a location in the first set of three locations and through the common center point intersects with a first reference point and b) distances between the first reference point and each of the other two locations in the first set of three locations are equal, and the locations in the second set of three locations are arranged such that a) a second reference axis, perpendicular to the first reference axis, that extends through a location in the second set of three locations and through the common center point intersects with a second reference point and b) distances between the second reference point and each of the other two locations in the second set of three locations are equal.

11. The apparatus of claim 1, wherein the first optical properties include a light-colored material and the second optical properties include a dark-colored material.

12. The apparatus of claim 1, wherein the first optical properties include white material and the second optical properties include black material.

13. An apparatus comprising:

a carrier structure sized to be placed within a semiconductor processing chamber such that at least three locations on the carrier structure are interposed between a pedestal of the semiconductor processing chamber and a showerhead disposed above the pedestal, wherein:

each of the at least three locations has a corresponding first component having a corresponding contact surface and a corresponding first reference surface, the contact surface and the reference surface for each first component are parallel to one another, each of the first components is connected with the carrier structure by a corresponding first flexure structure and a corresponding second flexure structure that are each pivotally connected with the carrier structure at a first end and pivotally connected with the corresponding first component at a second end opposite the first end, the first flexure structure and the second flexure structure that are pivotally connected with each first component are configured to constrain movement of that first component such that the contact surface thereof does not experience a substantial change in angular orientation during movement of the first component from a first position relative to the carrier structure to a second position relative to the carrier structure, and at least one of the first flexure structure and the second flexure structure for each first component includes a first trigger structure that is configured to protrude beyond a bottom surface of the carrier structure when that first component is in the first position relative to the carrier structure and that is further configured to be coincident with, but not pass through, a plane coincident with the bottom surface of the carrier structure when that first component is in the second position relative to the carrier structure.

14. The apparatus of claim 13, further comprising one or more second reference surfaces that are fixed in space with respect to the carrier structure and positioned such that when the first components are in the second configuration a gap is visible between the first reference surfaces and the one or more second reference surfaces when viewed along a direction parallel to the one or more second reference surfaces.

15. The apparatus of claim 13, wherein:

each of the at least three locations has a corresponding second component having a corresponding second reference surface, each of the second components is connected with the carrier structure by a third flexure structure and a fourth flexure structure that are each pivotally connected with the carrier structure at a first end and pivotally connected with the corresponding second component at a second end opposite the first end, the third flexure structure and the fourth flexure structure that are pivotally connected with each second component are configured to constrain movement of that second component such that the second reference surface thereof does not experience a substantial change in angular orientation during movement of the second component from a third position relative to the carrier structure to a fourth position relative to the carrier structure, at least one of the third flexure structure and the fourth flexure structure for each second component includes a second trigger structure that is configured to protrude beyond the bottom surface of the carrier structure when that second component is in the third position relative to the carrier structure and that is further configured to be coincident with, but not pass through, the plane coincident with the bottom surface of the carrier structure when that second component is in the fourth position relative to the carrier structure, and the second components are closer to the carrier structure than the contact surfaces of the first components when the first components are each in the second position and the second components are each in the fourth position.

16. An apparatus comprising:

a carrier structure sized to be placed within a semiconductor processing chamber such that at least three locations on the carrier structure are interposed between a pedestal of the semiconductor processing chamber and a showerhead disposed above the pedestal, wherein:

each of the at least three locations has a corresponding first component and a corresponding second component, the first component at each location is movable at least along a first axis relative to the second component at that location and relative to the carrier structure, the first component at each location is supported relative to the carrier structure in at least one direction by at least one corresponding compliant member that is configured to apply a biasing force to that first component that urges that first component into a corresponding first position relative to the carrier structure, an outer surface of the first component has first optical properties and an outer surface of the second component has second optical properties, the first optical properties and the second optical properties have high optical contrast with respect to one another, and the first component and the second component at each location are arranged such that when the first component is moved relative to the carrier structure along the first axis, an amount of the first component obscured by the second component when viewed along an axis perpendicular to the first axis changes, wherein:

the carrier structure has a ring-like shape, the at least three locations include a first set of three locations, and the locations in the first set of three locations are spaced apart from one another about the carrier structure.

17. The apparatus of claim 16, wherein:

the at least three locations further include a second set of three locations, and the locations in the second set of three locations are spaced apart from one another about the carrier structure and apart from the locations in the first set of three locations.

18. The apparatus of claim 17, wherein:

the locations in the first set of three locations and the second set of three locations are arranged about a common center point, the locations in the first set of three locations are arranged such that a) a first reference axis that extends through a location in the first set of three locations and through the common center point intersects with a first reference point and b) distances between the first reference point and each of the other two locations in the first set of three locations are equal, and the locations in the second set of three locations are arranged such that a) a second reference axis, perpendicular to the first reference axis, that extends through a location in the second set of three locations and through the common center point intersects with a second reference point and b) distances between the second reference point and each of the other two locations in the second set of three locations are equal.

19. The apparatus of claim 16, wherein:

each first component is a pin having a head and a shaft arranged along a center axis, and the at least one compliant member at each location is a spring that supports the pin at that location at least when the apparatus is oriented such that the head of that pin is directly above the shaft of that pin.

20. The apparatus of claim 19, wherein each spring has an outer ring, an inner ring, and a circular array of multiple flexure elements that each extend from the outer ring to the inner ring along a spiral path.

* * * * *